(12) United States Patent
Smith et al.

(10) Patent No.: US 10,524,377 B2
(45) Date of Patent: Dec. 31, 2019

(54) POWER DISTRIBUTION UNIT WITH INTERIOR BUSBARS

(71) Applicant: Eaton Corporation, Cleveland, OH (US)

(72) Inventors: Josiah Daniel Smith, Mission Viejo, CA (US); George Chen, Taipei (TW); John Douglas Carroll, Wake Forest, NC (US); Long Larry Le, Morrisville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/884,832

(22) Filed: Jan. 31, 2018

(65) Prior Publication Data

US 2019/0239379 A1 Aug. 1, 2019

(51) Int. Cl.
| | |
|---|---|
| *H05K 7/14* | (2006.01) |
| *G06F 1/26* | (2006.01) |
| *H01R 25/14* | (2006.01) |
| *H01R 13/717* | (2006.01) |
| *H01R 25/16* | (2006.01) |
| *H02B 1/32* | (2006.01) |
| *H01R 25/00* | (2006.01) |

(52) U.S. Cl.
CPC ............ *H05K 7/1457* (2013.01); *G06F 1/26* (2013.01); *H01R 13/7175* (2013.01); *H01R 25/003* (2013.01); *H01R 25/142* (2013.01); *H01R 25/162* (2013.01); *H02B 1/32* (2013.01); *H05K 7/1492* (2013.01); *G06F 2200/261* (2013.01)

(58) Field of Classification Search
CPC ... H05K 7/1457; G06F 1/26; G06F 2200/261; H01R 13/175; H01R 25/003; H01R 25/142; H01R 25/162; H02B 1/32
USPC .......................................................... 361/622
See application file for complete search history.

(56) References Cited

U.S. PATENT DOCUMENTS

| | | | |
|---|---|---|---|
| 4,740,167 A | 4/1988 | Millhimes et al. | |
| 5,144,530 A | 9/1992 | Cohen et al. | |
| 5,203,713 A | 4/1993 | French et al. | |
| 5,289,363 A | 2/1994 | Ferchau et al. | |
| 5,429,518 A * | 7/1995 | Chen ..................... | H01R 13/71 200/51.09 |
| 5,675,194 A | 10/1997 | Domigan | |
| 5,779,504 A | 7/1998 | Dominiak et al. | |

(Continued)

FOREIGN PATENT DOCUMENTS

| | | |
|---|---|---|
| AU | 2010265883 B2 | 2/2016 |
| AU | 2016203004 A1 | 5/2016 |

(Continued)

OTHER PUBLICATIONS

US 7,528,321 B2, 05/2009, Rasmussen et al. (withdrawn)

(Continued)

*Primary Examiner* — Anatoly Vortman
(74) *Attorney, Agent, or Firm* — Squire Patton Boggs US LLP

(57) ABSTRACT

A power distribution unit ("PDU") comprises a housing, a power module mechanically connected to the housing, at least one outlet module separately and mechanically connected to the housing, and a communications module mechanically connected to the housing. The PDU includes busbars that are electrically connected to the modules.

19 Claims, 25 Drawing Sheets

(56) References Cited

U.S. PATENT DOCUMENTS

| | | | |
|---|---|---|---|
| 5,870,276 A | 2/1999 | Leach et al. | |
| 5,949,974 A | 9/1999 | Ewing et al. | |
| 5,982,610 A | 11/1999 | Crawford et al. | |
| 6,015,307 A * | 1/2000 | Chiu | H01R 13/71 |
| | | | 200/51.09 |
| 6,086,397 A * | 7/2000 | Chapman | H01R 25/003 |
| | | | 439/214 |
| 6,220,880 B1 * | 4/2001 | Lee | H01R 25/003 |
| | | | 439/214 |
| 6,514,093 B1 * | 2/2003 | Yu | H01R 25/006 |
| | | | 439/105 |
| 6,611,724 B1 | 8/2003 | Buda et al. | |
| 6,663,435 B2 * | 12/2003 | Lincoln, III | H01R 25/003 |
| | | | 439/115 |
| 6,675,302 B2 | 1/2004 | Ykema | |
| 6,711,613 B1 | 3/2004 | Ewing et al. | |
| 6,750,410 B2 * | 6/2004 | Lee | C08J 9/0004 |
| | | | 200/51 R |
| 6,939,180 B1 * | 9/2005 | Wu | H01R 13/713 |
| | | | 439/650 |
| 7,010,589 B2 | 3/2006 | Ewing et al. | |
| 7,043,543 B2 | 5/2006 | Ewing et al. | |
| 7,099,934 B1 | 8/2006 | Ewing et al. | |
| 7,137,850 B2 | 11/2006 | Ewing et al. | |
| 7,162,521 B2 | 1/2007 | Ewing et al. | |
| 7,171,461 B2 | 1/2007 | Ewing et al. | |
| 7,187,177 B2 | 3/2007 | Kelly et al. | |
| 7,196,900 B2 | 3/2007 | Ewing et al. | |
| 7,215,535 B2 | 5/2007 | Pereira | |
| 7,268,998 B2 * | 9/2007 | Ewing | H05K 7/1492 |
| | | | 174/59 |
| 7,312,980 B2 | 12/2007 | Ewing et al. | |
| 7,365,964 B2 | 4/2008 | Donahue, IV | |
| 7,377,807 B2 | 5/2008 | Ohman | |
| 7,394,667 B2 | 7/2008 | Kelly et al. | |
| 7,400,493 B2 | 7/2008 | Ewing et al. | |
| 7,447,002 B2 | 11/2008 | Ewing et al. | |
| 7,457,106 B2 * | 11/2008 | Ewing | H01R 25/006 |
| | | | 340/635 |
| 7,535,696 B2 | 5/2009 | Ewing et al. | |
| 7,581,977 B1 * | 9/2009 | Wu | H01R 13/7036 |
| | | | 439/106 |
| 7,606,014 B2 | 10/2009 | Ziegler et al. | |
| 7,619,868 B2 | 11/2009 | Spitaels et al. | |
| 7,675,739 B2 | 3/2010 | Ewing et al. | |
| 7,702,771 B2 | 4/2010 | Ewing et al. | |
| 7,706,134 B2 | 4/2010 | Ewing et al. | |
| 7,742,284 B2 | 6/2010 | Ewing et al. | |
| 7,759,575 B2 | 7/2010 | Jones et al. | |
| 7,764,775 B2 | 7/2010 | Tarkoff et al. | |
| 7,774,443 B2 | 8/2010 | Ewing et al. | |
| 7,905,749 B2 | 3/2011 | Cleveland | |
| 7,940,504 B2 | 5/2011 | Spitaels et al. | |
| 7,982,335 B2 * | 7/2011 | Aldag | H01R 25/142 |
| | | | 307/11 |
| 7,990,689 B2 | 8/2011 | Ewing et al. | |
| 8,004,827 B2 | 8/2011 | Ewing et al. | |
| 8,027,134 B2 | 9/2011 | Ziegler et al. | |
| 8,038,454 B2 * | 10/2011 | Jiang | H01R 25/003 |
| | | | 439/106 |
| 8,053,672 B2 | 11/2011 | Behrens et al. | |
| 8,093,748 B2 | 1/2012 | Martins | |
| 8,207,627 B2 | 6/2012 | Aldag et al. | |
| 8,212,427 B2 | 7/2012 | Spitaels et al. | |
| 8,264,099 B2 | 9/2012 | Aldag et al. | |
| 8,305,737 B2 | 11/2012 | Ewing et al. | |
| 8,305,739 B2 | 11/2012 | Dozier | |
| 8,321,163 B2 | 11/2012 | Ewing et al. | |
| 8,341,837 B2 | 1/2013 | Braunstein et al. | |
| 8,403,736 B2 | 3/2013 | Rasmussen et al. | |
| 8,427,007 B2 | 4/2013 | Jansma et al. | |
| 8,427,301 B2 | 4/2013 | Siegman | |
| 8,489,667 B2 | 7/2013 | Ewing et al. | |
| 8,494,661 B2 | 7/2013 | Ewing et al. | |
| 8,503,149 B2 | 8/2013 | Spitaels et al. | |
| 8,510,424 B2 | 8/2013 | Ewing et al. | |
| 8,527,619 B2 | 9/2013 | Ewing et al. | |
| 8,549,062 B2 | 10/2013 | Ewing et al. | |
| 8,549,067 B2 | 10/2013 | Ewing et al. | |
| 8,560,652 B2 | 10/2013 | Ewing et al. | |
| 8,587,950 B2 | 11/2013 | Ewing et al. | |
| 8,601,291 B2 | 12/2013 | Ewing et al. | |
| 8,610,316 B2 | 12/2013 | Spitaels et al. | |
| 8,619,412 B2 | 12/2013 | Ewing et al. | |
| 8,625,255 B2 * | 1/2014 | Linnane | H02G 3/0608 |
| | | | 361/611 |
| 8,694,272 B2 | 4/2014 | Ewing et al. | |
| 8,780,555 B2 | 7/2014 | Fink et al. | |
| 8,902,569 B1 | 12/2014 | Wishman et al. | |
| 9,009,288 B2 | 4/2015 | Ewing et al. | |
| 9,104,393 B2 | 8/2015 | Ewing et al. | |
| 9,142,971 B2 | 9/2015 | Ewing et al. | |
| 9,166,382 B2 | 10/2015 | Ewing et al. | |
| 9,270,089 B2 | 2/2016 | Bailey et al. | |
| 9,271,423 B2 | 2/2016 | Krenz | |
| 9,276,388 B2 | 3/2016 | Ewing et al. | |
| 9,281,692 B2 | 3/2016 | Hui | |
| 9,287,688 B2 | 3/2016 | Ewing et al. | |
| 9,316,672 B2 * | 4/2016 | Soneda | G01R 21/1333 |
| 9,400,726 B2 | 7/2016 | Nicholson et al. | |
| 2002/0002582 A1 | 1/2002 | Ewing et al. | |
| 2002/0002593 A1 | 1/2002 | Ewing et al. | |
| 2003/0052543 A1 | 3/2003 | Boost | |
| 2003/0126253 A1 | 7/2003 | Ewing et al. | |
| 2004/0205181 A1 | 10/2004 | Ewing et al. | |
| 2004/0215763 A1 | 10/2004 | Ewing et al. | |
| 2005/0203987 A1 | 9/2005 | Ewing et al. | |
| 2005/0223090 A1 | 10/2005 | Ewing et al. | |
| 2005/0259383 A1 | 11/2005 | Ewing et al. | |
| 2006/0031453 A1 | 2/2006 | Ewing et al. | |
| 2006/0031454 A1 | 2/2006 | Ewing et al. | |
| 2006/0092600 A1 | 5/2006 | Ewing et al. | |
| 2006/0094299 A1 | 5/2006 | Ewing et al. | |
| 2006/0139855 A1 | 6/2006 | Ewing et al. | |
| 2006/0199438 A1 | 6/2006 | Cleveland | |
| 2006/0221524 A1 | 10/2006 | Kelly et al. | |
| 2006/0227474 A1 | 10/2006 | Kelly et al. | |
| 2006/0232366 A1 * | 10/2006 | Li | H01H 71/2445 |
| | | | 335/151 |
| 2006/0259538 A1 | 11/2006 | Ewing et al. | |
| 2007/0016664 A1 | 1/2007 | Ewing et al. | |
| 2007/0050443 A1 | 3/2007 | Ewing et al. | |
| 2007/0076340 A1 | 4/2007 | Ewing et al. | |
| 2007/0128927 A1 | 6/2007 | Cleveland | |
| 2007/0130243 A1 | 6/2007 | Ewing et al. | |
| 2007/0136453 A1 | 6/2007 | Ewing et al. | |
| 2007/0140238 A1 | 6/2007 | Ewing et al. | |
| 2007/0159752 A1 | 7/2007 | Ewing et al. | |
| 2007/0159775 A1 | 7/2007 | Ewing et al. | |
| 2007/0161293 A1 | 7/2007 | Ewing et al. | |
| 2007/0184721 A1 | 8/2007 | Ewing et al. | |
| 2007/0245012 A1 | 10/2007 | Ewing et al. | |
| 2007/0291430 A1 | 12/2007 | Spitaels et al. | |
| 2007/0291433 A1 | 12/2007 | Ziegler et al. | |
| 2008/0076291 A1 | 3/2008 | Ewing et al. | |
| 2008/0093927 A1 | 4/2008 | Ewing et al. | |
| 2008/0198536 A1 | 8/2008 | Ewing et al. | |
| 2008/0266759 A1 | 10/2008 | Kelly et al. | |
| 2008/0272878 A1 | 11/2008 | Ewing et al. | |
| 2009/0061691 A1 | 3/2009 | Ewing et al. | |
| 2009/0180241 A1 | 7/2009 | Ewing et al. | |
| 2009/0213567 A1 * | 8/2009 | Mandapat | H01R 13/7175 |
| | | | 362/95 |
| 2009/0234512 A1 | 9/2009 | Ewing et al. | |
| 2009/0236909 A1 | 9/2009 | Aldag et al. | |
| 2009/0323258 A1 | 12/2009 | Ziegler et al. | |
| 2010/0020475 A1 | 1/2010 | Spitaels et al. | |
| 2010/0033019 A1 | 2/2010 | Connell et al. | |
| 2010/0084921 A1 | 4/2010 | Martins | |
| 2010/0208435 A1 | 8/2010 | Ewing et al. | |
| 2010/0253143 A1 | 10/2010 | Ewing et al. | |
| 2010/0259871 A1 | 10/2010 | Ewing et al. | |
| 2010/0280774 A1 | 11/2010 | Ewing et al. | |

(56) References Cited

U.S. PATENT DOCUMENTS

| | | | |
|---|---|---|---|
| 2010/0306559 A1 | 12/2010 | Ewing et al. | |
| 2010/0328849 A1 | 12/2010 | Ewing et al. | |
| 2011/0136353 A1 | 6/2011 | Spitaels et al. | |
| 2011/0167280 A1 | 7/2011 | Ewing et al. | |
| 2011/0187348 A1* | 8/2011 | Soneda | H01R 25/003 324/117 H |
| 2011/0197080 A1 | 8/2011 | Ewing et al. | |
| 2011/0205693 A1 | 8/2011 | Jansma et al. | |
| 2011/0223785 A1* | 9/2011 | Jiang | H01R 25/003 439/106 |
| 2011/0237097 A1 | 9/2011 | Aldag et al. | |
| 2011/0244715 A1 | 10/2011 | Aldag et al. | |
| 2011/0296224 A1 | 12/2011 | Ewing et al. | |
| 2011/0304958 A1 | 12/2011 | Dozier | |
| 2011/0316690 A1 | 12/2011 | Siegman | |
| 2012/0042180 A1 | 2/2012 | Ewing et al. | |
| 2012/0075776 A1 | 3/2012 | Ewing et al. | |
| 2012/0081842 A1 | 4/2012 | Ewing et al. | |
| 2012/0081843 A1 | 4/2012 | Ewing et al. | |
| 2012/0086425 A1 | 4/2012 | Suchoff | |
| 2012/0087051 A1 | 4/2012 | Spitaels et al. | |
| 2012/0117396 A1 | 5/2012 | Ewing et al. | |
| 2012/0229515 A1 | 9/2012 | Cao | |
| 2012/0307421 A1 | 12/2012 | Ewing et al. | |
| 2013/0090869 A1 | 4/2013 | Ewing et al. | |
| 2013/0140915 A1 | 6/2013 | Spitaels et al. | |
| 2014/0041929 A1 | 2/2014 | Irons et al. | |
| 2014/0070628 A1 | 3/2014 | Ewing et al. | |
| 2014/0102746 A1 | 4/2014 | Wrightson et al. | |
| 2014/0107854 A1 | 4/2014 | Ewing et al. | |
| 2014/0111908 A1 | 4/2014 | Ewing et al. | |
| 2014/0126116 A1 | 5/2014 | Irons | |
| 2014/0126117 A1 | 5/2014 | Ewing et al. | |
| 2014/0126118 A1 | 5/2014 | Ewing et al. | |
| 2014/0144670 A1 | 5/2014 | Irons et al. | |
| 2014/0160637 A1 | 6/2014 | Liu et al. | |
| 2014/0204504 A1 | 7/2014 | Ewing et al. | |
| 2014/0218008 A1 | 8/2014 | Ewing et al. | |
| 2014/0236372 A1 | 8/2014 | Ewing et al. | |
| 2014/0285018 A1 | 9/2014 | Ewing et al. | |
| 2014/0304534 A1 | 10/2014 | Ewing et al. | |
| 2014/0329467 A1 | 11/2014 | Ewing et al. | |
| 2015/0072553 A1 | 3/2015 | Irons | |
| 2015/0135783 A1 | 5/2015 | Jiang et al. | |
| 2015/0177797 A1 | 6/2015 | Butzer et al. | |
| 2015/0188269 A1 | 7/2015 | Kim et al. | |
| 2015/0207302 A1 | 7/2015 | Lv et al. | |
| 2015/0214683 A1 | 7/2015 | Irons | |
| 2015/0222047 A1 | 8/2015 | Utz et al. | |
| 2015/0222063 A1 | 8/2015 | Irons et al. | |
| 2015/0236507 A1 | 8/2015 | Burant | |
| 2015/0241897 A1 | 8/2015 | Ewing et al. | |
| 2015/0249324 A1 | 9/2015 | Billman et al. | |
| 2015/0263513 A1 | 9/2015 | Newell et al. | |
| 2015/0355695 A1 | 12/2015 | Ewing et al. | |
| 2015/0362941 A1 | 12/2015 | Ewing et al. | |
| 2015/0370297 A1 | 12/2015 | Schroeder et al. | |
| 2015/0372462 A1 | 12/2015 | Mills et al. | |
| 2016/0011639 A1 | 1/2016 | Ewing et al. | |
| 2016/0020584 A1 | 1/2016 | Zhang et al. | |
| 2016/0079722 A1 | 3/2016 | Ewing et al. | |
| 2016/0120049 A1 | 4/2016 | Chen | |
| 2016/0164292 A1 | 6/2016 | Ewing et al. | |
| 2016/0165744 A1 | 6/2016 | Bailey et al. | |

FOREIGN PATENT DOCUMENTS

| | | |
|---|---|---|
| AU | 2016203402 | 6/2016 |
| AU | 2016203402 A1 | 6/2016 |
| CA | 2229571 A1 | 4/1997 |
| CA | 2229571 C | 9/2006 |
| CA | 2602505 | 10/2006 |
| CA | 2713428 A1 | 7/2009 |
| CA | 2878655 | 7/2009 |
| CA | 2766807 | 12/2010 |
| CA | 2801073 | 12/2011 |
| CA | 2803493 | 12/2011 |
| CA | 2837880 | 12/2012 |
| CA | 2889216 | 5/2014 |
| CA | 2713428 C | 3/2015 |
| CA | 2801073 | 1/2016 |
| CN | 1054476 C | 7/2000 |
| CN | 2634685 | 8/2004 |
| CN | 1171366 | 10/2004 |
| CN | 201061085 | 5/2008 |
| CN | 201340984 | 11/2009 |
| CN | 201369583 | 12/2009 |
| CN | 201726058 | 1/2011 |
| CN | 101110514 B | 6/2011 |
| CN | 202059085 | 11/2011 |
| CN | 101807775 | 3/2012 |
| CN | 101123344 B | 9/2012 |
| CN | 202434789 | 9/2012 |
| CN | 202872201 | 4/2013 |
| CN | 202977986 | 6/2013 |
| CN | 202978089 | 6/2013 |
| CN | 203103767 | 7/2013 |
| CN | 102208833 | 1/2014 |
| CN | 203607683 | 5/2014 |
| CN | 103858292 A | 6/2014 |
| CN | 103872585 | 6/2014 |
| CN | 203645149 | 6/2014 |
| CN | 203645933 | 6/2014 |
| CN | 203645962 | 6/2014 |
| CN | 203661449 | 6/2014 |
| CN | 103915765 | 7/2014 |
| CN | 203812166 | 9/2014 |
| CN | 203911108 | 10/2014 |
| CN | M3951356 | 11/2014 |
| CN | 104199534 | 12/2014 |
| CN | 204130787 | 1/2015 |
| CN | 204179491 | 2/2015 |
| CN | 204179497 | 2/2015 |
| CN | M4333678 | 5/2015 |
| CN | M4333679 | 5/2015 |
| CN | 204481214 | 7/2015 |
| CN | 102035148 B | 8/2015 |
| CN | 104904075 A | 9/2015 |
| CN | 204667227 | 9/2015 |
| CN | 104979761 A | 10/2015 |
| CN | 204696497 | 10/2015 |
| CN | 105244672 | 1/2016 |
| CN | 103986225 | 4/2016 |
| CN | 105470930 | 4/2016 |
| CN | 205248637 | 5/2016 |
| CN | 103582397 | 6/2016 |
| EP | 185563 | 1/1990 |
| EP | 407241 B1 | 7/1993 |
| EP | 655818 | 5/1997 |
| EP | 2255419 | 12/2010 |
| EP | 262937961 | 10/2015 |
| EP | 3002955 A1 | 4/2016 |
| EP | 244002961 | 5/2016 |
| FR | 2547694 | 12/1984 |
| IN | 2196/CHE/2012 | 12/2013 |
| IN | 2517/MUM/2013 | 9/2015 |
| IN | 4059/CHE/2012 | 4/2016 |
| JP | 2012503958 A | 2/2012 |
| JP | 05351251 B2 | 11/2013 |
| MX | 2012013967 | 3/2013 |
| TW | 201412224 | 3/2014 |
| WO | 1994002062 A1 | 2/1994 |
| WO | 2007008176 | 1/2007 |
| WO | 2013095352 A1 | 6/2013 |
| WO | 2014089979 | 6/2014 |
| WO | 2016100252 | 6/2016 |

OTHER PUBLICATIONS

International Search Report and Written Opinion; corresponding PCT Application No. PCT/EP2019/025031, International Filing

(56) References Cited

OTHER PUBLICATIONS

Date Jan. 31, 2019; Authorized Officer Brigitta Klag; dated May 29, 2019.

* cited by examiner

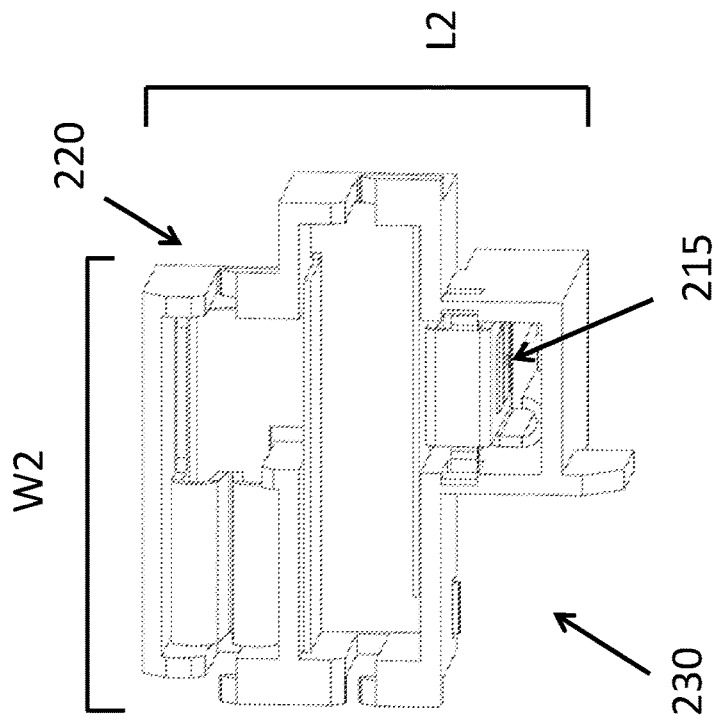
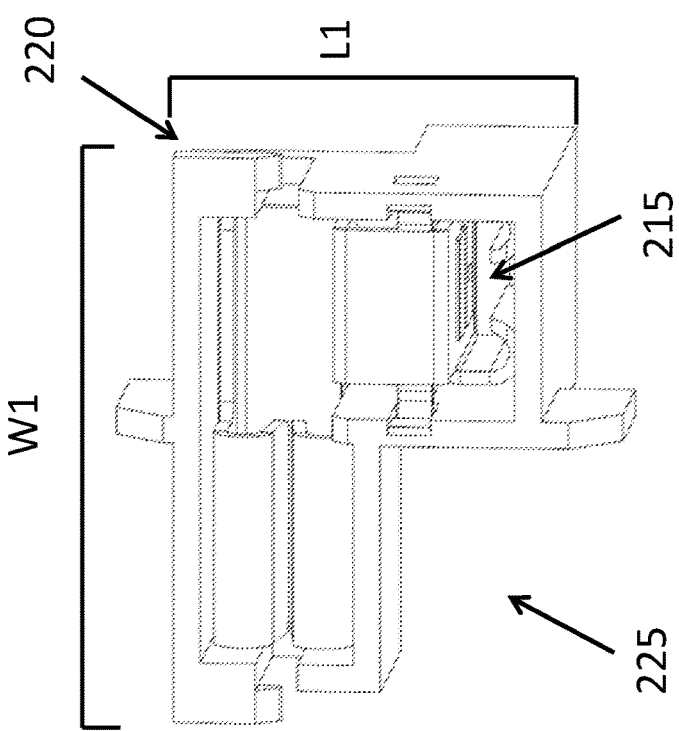
Fig. 6A
Fig. 6B

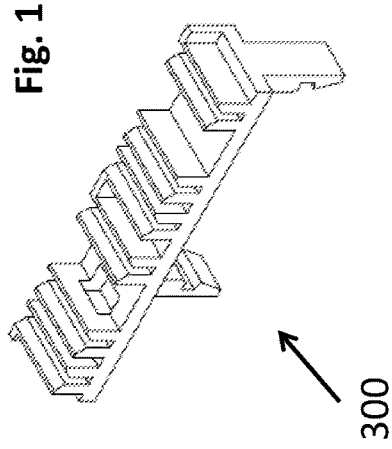
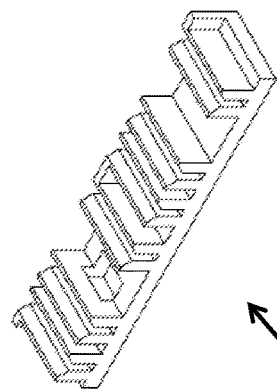
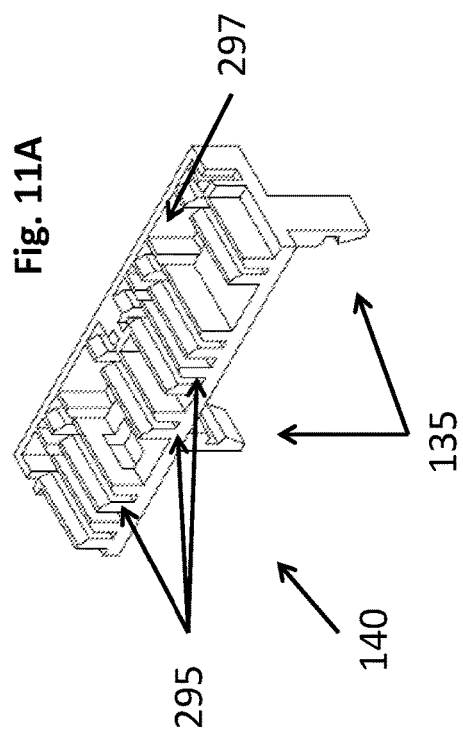
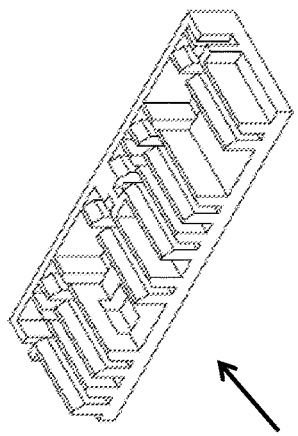

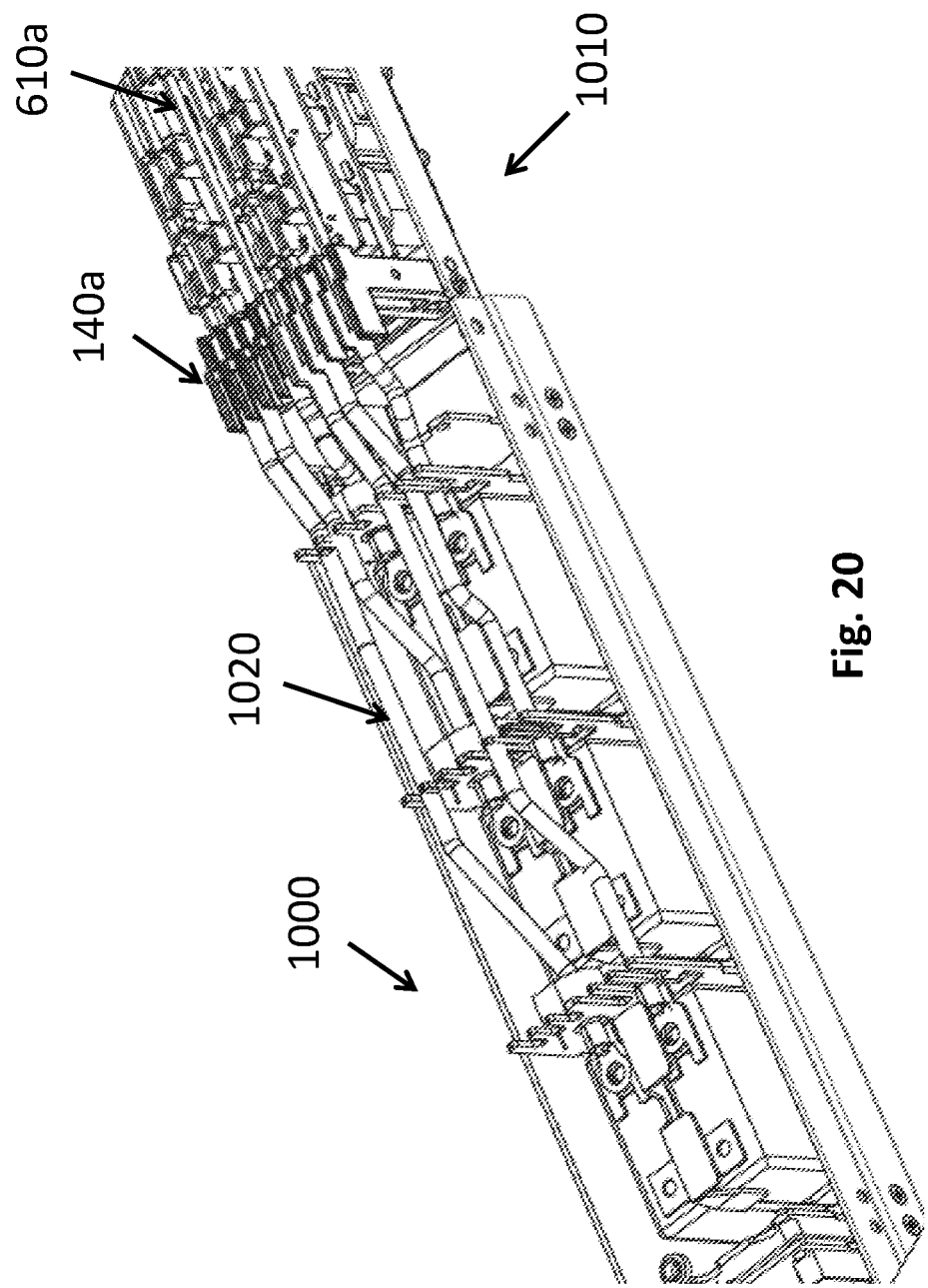

POWER DISTRIBUTION UNIT WITH INTERIOR BUSBARS

FIELD OF INVENTION

The present disclosure relates power distribution units ("PDUs"). More specifically, the present disclosure relates to PDUs that include interior busbars for distributing power to outlets of the PDU.

BACKGROUND

In data centers and other industrial environments, a power source is typically provided to information technology ("IT") equipment with a three-phase busway that carries current. Each phase can be provided separately to different types of IT equipment. In some instances, the three-phase busway provides power to a rack that holds electrical equipment such as servers. The IT equipment located in the rack receives power from the busway via a PDU mounted to the rack frame. The PDU includes a connection to the three-phase busway, and a plurality of components to provide, regulate, and monitor the current being distributed to the IT equipment in the rack. Some examples of the components used in such a PDU include outlet modules, communications modules, circuit breakers, and sensors.

Some PDUs include three circuit breakers, one for each phase of the busway. The current from each busway passes through a circuit breaker before being distributed to an outlet, and then to the downstream equipment. Because the PDUs are mounted vertically in a rack frame, the outlets receiving current from a particular phase are typically clustered together in sections being approximately 16 inches long.

Phase balancing may be performed to improve the reliability of upstream electrical equipment, such as generators, switchgear, and 3-phase UPSs. Electrical utilities may also penalize customers if their loads are grossly unbalanced. However, in order for a user to balance the load on each phase of the PDU, the user must use varying lengths of cable to distribute the equipment connections evenly between the outlets of the three-phases. This process is cumbersome and inefficient for the user.

The circuit breaker connections to each outlet may be alternated. For example, the first outlet of every three outlets would be connected to the first circuit breaker, the second to the second circuit breaker, and the third to the third circuit breaker. Such a solution requires significant wiring, which increases the risk of connection errors at the manufacturing level and increases costs for labor and parts. The present disclosure provides an alternate method for providing the benefit of alternating the circuit breaker connections to alternating outlets, while eliminating the drawbacks of separately wiring each outlet to a circuit breaker.

SUMMARY

In one embodiment, a PDU includes an input power component containing a circuit protection device and an outlet component including a plurality of outlets permanently fixed to a chassis and a plurality of busbars extending the length of the outlet unit. The busbars are electrically connected to a plurality of circuit protection device. A communications component is in signal communication with the outlet component for transferring data. A housing is connected to the power component, the outlet component, and the communications component.

In another embodiment, a PDU assembly includes a plurality of outlets, at least one pin extending from each outlet, and a plurality of busbars. The PDU assembly further includes a plurality of electrical connections between the busbars and outlet pins. Each electrical connection connects a single outlet pin to a single busbar.

In yet another embodiment, a PDU assembly includes a housing, a power source mechanically connected to the housing, and a plurality of outlets mechanically connected to the housing. The PDU assembly further includes a set of busbars and a plurality of jumpers that electrically connect at least some of the plurality of outlets to the set of busbars.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

FIG. 6A is a detailed view of the small jumpers of the outlet module section of FIG. 2;

FIG. 6B is a detailed view of the large jumpers of the outlet module section of FIG. 2;

FIG. 11A is a detailed view of the busbar cap according to the embodiment of FIG. 2;

FIG. 11B is a detailed view of an intermediate busbar cap according to another embodiment;

FIG. 11C is a detailed view of an alternative busbar cap lacking protruding arms according to another embodiment;

FIG. 11D is a detailed view of an intermediate busbar cap lacking protruding walls and lacking a back wall according to another embodiment;

FIG. 20 is a perspective view of one embodiment of an input module connected to an output module.

DETAILED DESCRIPTION

Figure 1:
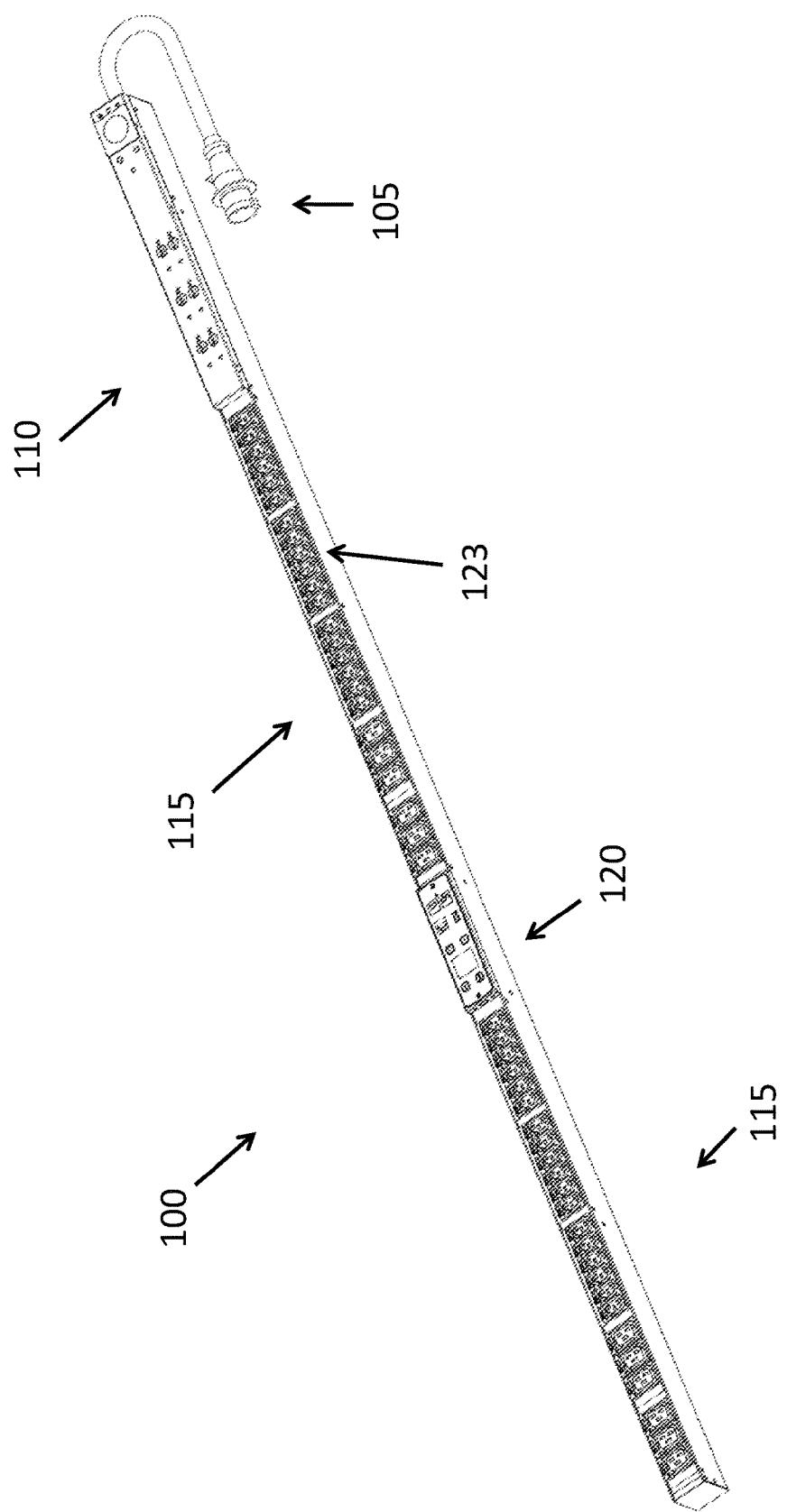
FIG. 1 is a perspective view of a smart PDU according to an embodiment of the present disclosure.

FIG. 1 is a profile view of PDU 100 according to an embodiment of the present disclosure. PDU 100 is an assembly that includes a plug 105, a power module 110, outlet modules 115, and a communications module 120 located between the two outlet modules 115. Each of the modules is individually and separately connected to housing 123, which extends the length of the PDU 100. In alternative embodiments (not shown), the PDU could include different combinations of modules, such as one outlet module or two communications modules. In another alternative embodiment, the PDU assembly is not modular. For example, a first PDU assembly could share one chassis with other PDU assemblies to form one PDU without separate modules.

The PDU 100 is configured to be mounted in a rack frame, and to provide power to equipment located in the rack. The racks may house IT equipment, such as servers, data storage, and other similar equipment. PDU 100 includes mounting features (not shown) that are used to fix PDU 100 to a rack frame. Exemplary mounting features include, without limitation, mechanical fasteners, locking mechanisms, protruding pins and corresponding slots, etc. (not shown).

Plug 105 is configured to be connected to an outlet of a three-phase power source to provide power to the power module 110. Power module 110 in turn distributes the power to the outlet modules 115 and communications module 120. Plug 105 is configured to draw current from the three-phase current source outlet. Power module 110 includes three circuit protection devices (not shown), with each circuit protection device corresponding to one phase of the current source. Circuit protection devices may include, without limitation, circuit breakers, fuses, residual-current devices, reclosers, polyswitches, and any combination of these and other protection devices. In alternative embodiments (not shown), six circuit protection devices can be included, with two circuit protection devices connected to each phase in parallel. The current received from plug 105 first passes through a circuit protection device before being distributed to the outlet modules 115 or communications module 120.

Outlet modules 115 provide power to equipment mounted in the rack, through the equipment plugs. Communications module 120 provides information related to PDU performance or operating characteristics. Examples of performance or operating characteristics include, without limitation, voltage, current, frequency, power, and energy. The communications module 120 can provide this information to a user using a variety of communications technologies, such as wireless internet (or intranet) transmitters, Bluetooth, a physical display, indicator lights etc.

Figure 1A:
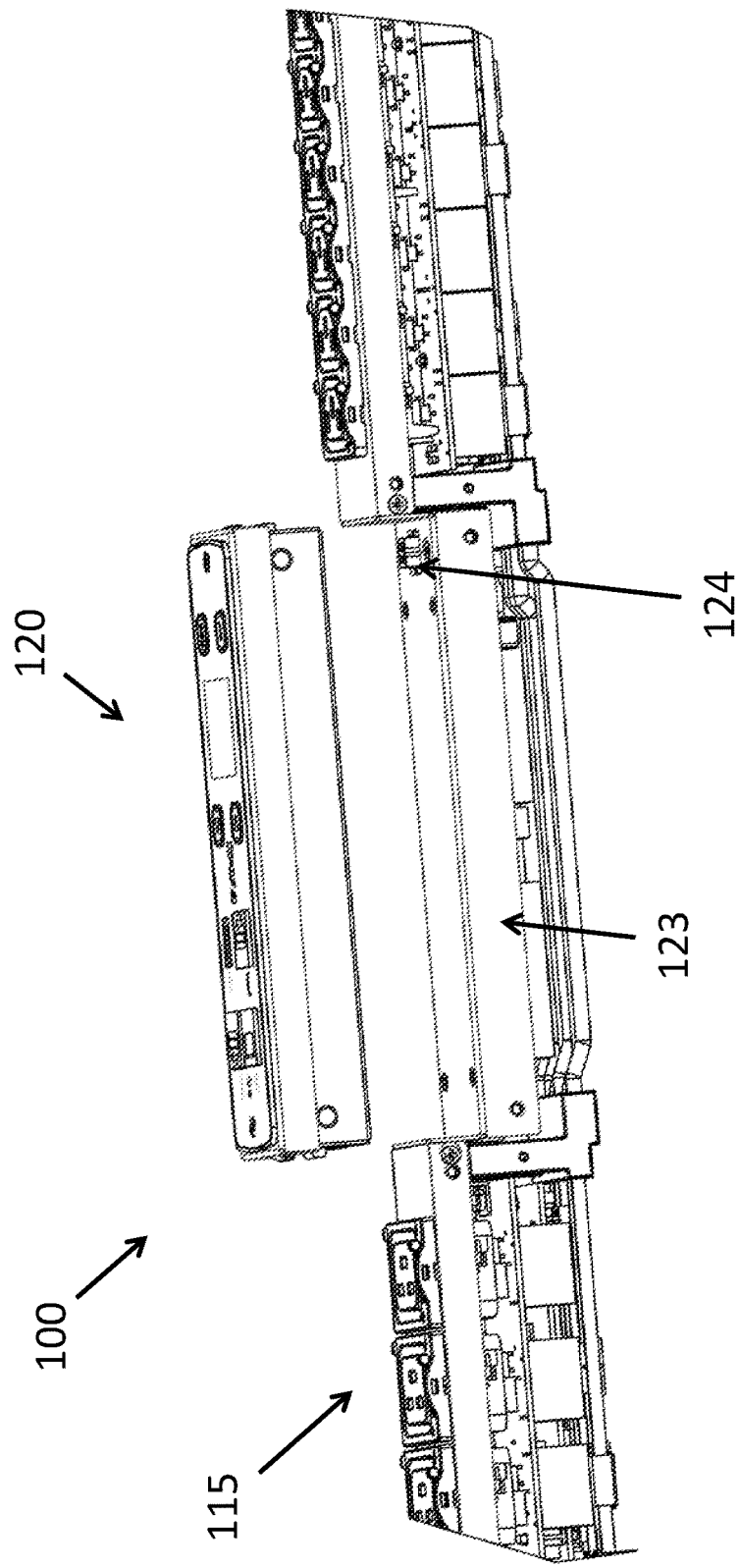
FIG. 1A is a close up perspective view of a portion of the smart PDU of FIG. 1, with a module removed.

The PDU 100 of FIG. 1 is a modular PDU that includes mechanically-independent modules 110, 115, 120. As can be better seen in FIG. 1A, the modules 110, 115, 120 are not mechanically connected to each other, but are instead secured directly to the housing 123 at a connection location 124. Wires are used to connect the modules. Standardized connection points such as busbars or connector locations may be employed.

In one embodiment, the communication module 120 can be temporarily removed from the PDU to allow power supplies to be replaced or for other equipment to be serviced. The communication module 120 can also be mounted remotely from the PDU at an angle, to allow it to be more easily viewed.

Such modular designs allow for customized configurations for specific applications. However, the busbar system described below may be used in non-modular systems.

Figure 2:
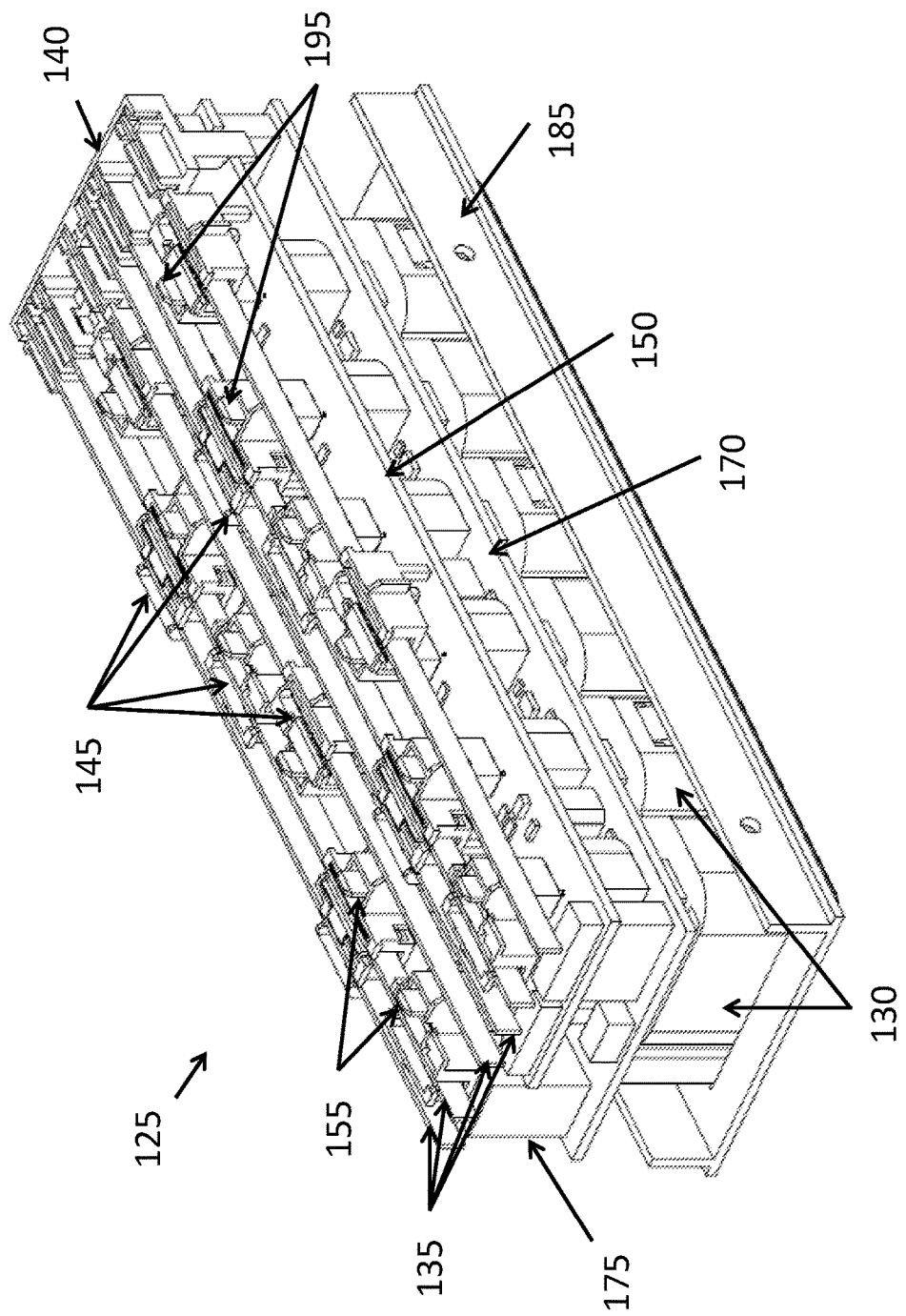
FIG. 2 is a perspective view of an outlet module section according to the embodiment of FIG. 1.
Figure 3:
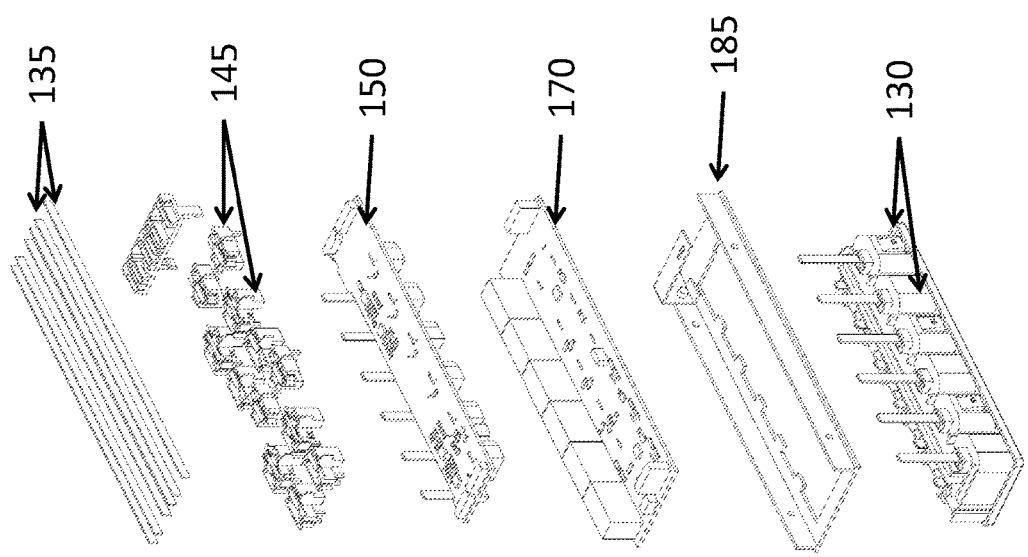
FIG. 3 is an exploded view of the outlet module section of FIG. 2.

FIG. 2 shows a perspective view of a section 125 of one outlet module 115, with the outlets 130 facing downwards. The components of outlet module section 125 are more easily seen in FIG. 3, which depicts an exploded drawing of outlet module section 125 from the same perspective as in FIG. 2. The outlet module section 125 in this embodiment has six outlets 130. In one embodiment, each outlet module 115 has three outlet module sections 125 with six outlets each, and two additional smaller outlet module sections (not shown) with three outlets each. The components and functioning of each outlet module section may be similar, so only outlet module section 125 will be described in detail below.

A set of busbars 135 runs the length of the entire outlet module 115 in the present embodiment, and delivers current to the outlets 130 in each outlet module section 125. In this embodiment, the set of busbars 135 includes six busbars. At one or both ends of the outlet module 115, a busbar cap 140 receives all six busbars 135 and maintains the distance between each busbar.

Jumpers 145 connect the busbars 135 to the appropriate pins of printed circuit board assembly ("PCBA") 150, which are electrically connected to outlets 130. Jumpers 145 are further connected to pins of outlets 130.

PCBA 150 includes a number of PCBA pins 155 that correspond to the number of outlets 130 in the outlet module section 125. PCBA 150 further includes two microprocessors 160 that communicates with communications module 120 and relay board 170. Relay board 170 contains relays 175 and LEDs.

Chassis 185 is a one-piece frame that extends the length of the outlet module 115 and receives each outlet module section 125. Chassis 185 is made from a metal, such as aluminum or an aluminum alloy, and extends the entire length of the outlet module 115. A single chassis 185 includes a plurality of openings 190 (more clearly shown in FIG. 9), each opening sized to receive all outlets of an outlet module section 125 in a snap-fit type interface. The chassis 185 in this embodiment includes five openings 190, to receive all five-outlet module sections 125.

Each outlet 130 includes an outlet pin 195 extending in a direction opposite the outlet face. In the illustrated embodiment, multiple outlets 130 are disposed in one molded plastic assembly that includes an integrated busbar for grounding all of the outlets. Grounding path provides grounding for equipment plugged into each outlet 130. In alternative embodiments (not shown), an individual outlet is disposed in each assembly.

Additional details of the outlet module 125 and its components are shown in FIGS. 4-11.

Figure 4:
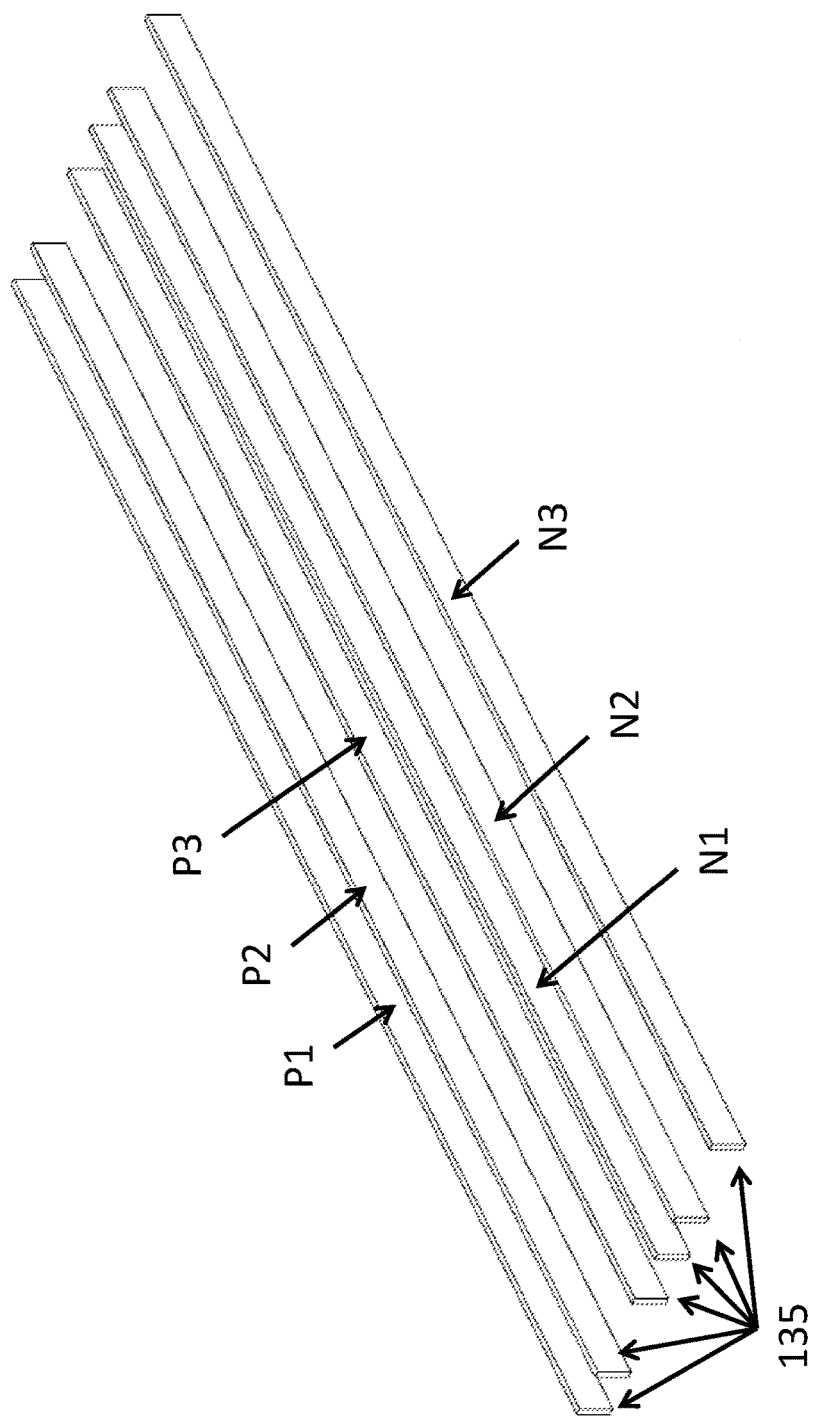
FIG. 4 is a detailed perspective view of a section of the busbars extending into the outlet module section of FIG. 2.

With reference to FIG. 4, six busbars 135 are included in each outlet module 115. Busbars 135 are made from a conductive material, such as phosphor bronze, copper or an alloy. Each of the busbars 135 is connected via wiring to one of three circuit protection devices in the power module 110 (not shown). Each circuit protection device receives power from one of the three current phases received via the plug 105 from an external source. Three of the busbars, P1, P2, and P3, carry input current corresponding to their respective phases. The other three busbars N1, N2, and N3 are neutral lines (electrically connected to either a different phase or an actual neutral) that each complete a circuit with the respective busbars P1, P2, and P3 when busbars are joined to the pins 155, 195 with jumpers 145. In other words, busbar P1 is electrically connected at one end to a circuit protection device, and at another portion to one of the PCBA pins 155 that is in turn connected to an outlet 130. Busbar N1 connects to the corresponding outlet pin 195 on the same outlet 130, and at another end either to a circuit protection device or directly to a neutral. Each outlet 130 is thus connected to one of the busbars P1, P2, and P3 via a pin 155, and also connected to the corresponding busbar N1, N2, and N3 via a pin 195. When a user plugs equipment into the outlet 130, the circuit including the circuit protection device, busbars P1 and N1, outlet 130, and user equipment is closed, thereby providing power to the user equipment.

In alternative embodiments (not shown), greater or fewer than six busbars may be used. For example, four or eight busbars may be employed. In other alternative embodiment (not shown), jumpers could be soldered to busbars and pins, or could be connected via any other permanent connection means.

Figure 5:
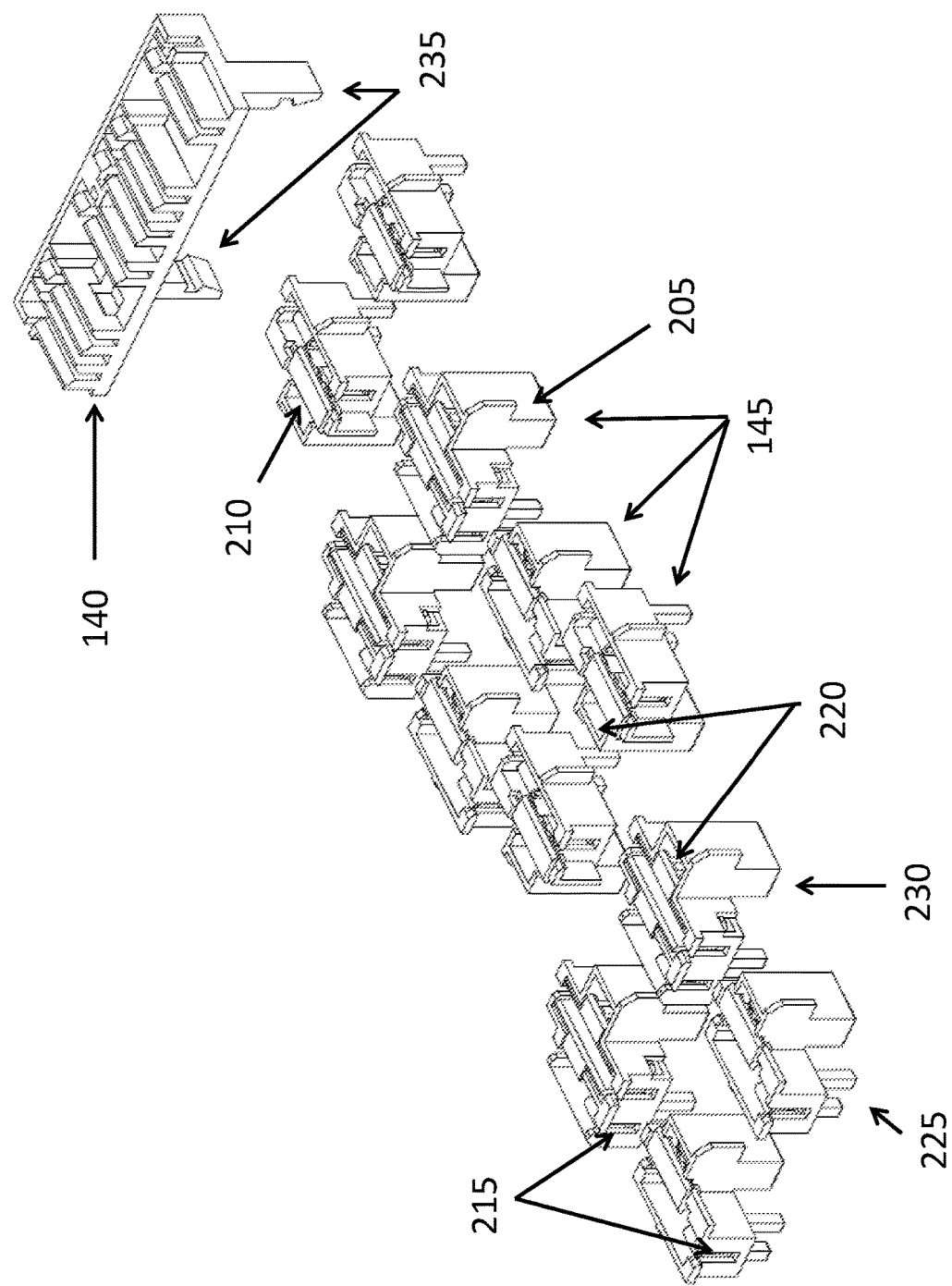
FIG. 5 is a detailed perspective view of the jumpers busbar caps of the outlet module section of FIG. 2.

FIG. 5 shows a detailed view of jumpers 145 and busbar cap 140. Jumpers 145 are configured to connect a pin (either PCBA pin 155 or outlet pin 195) to a busbar 135. Jumpers 145 can be made with a plastic (or other non-conductive material) housing 205 and a conductive element 210, such as copper or phosphor bronze. Conductive element 210 is located on the bottom of a groove 215 in each jumper 145. Housings 205 each include one opening 220. Conductive element 210 is affixed to housing 205 such that conductive element 210 extends into the opening 220 and meets pin 155 or 195 when the pin is inserted into opening 220. Conductive element 210 lines the inner walls of opening 220, such that when pin 155 or 195 is inserted, the pin fits snugly into opening 220.

Grooves 215 of jumpers 145 are sized and shaped to receive a busbar 135. Conductive element 210 is located at a bottom of groove 215, so that when a busbar 135 is placed therein, the busbar fits snugly into groove 215 and meets conductive element 210. By installing jumpers 145 onto both a pin 155, 195 and busbar 135, the conductive element 210 thereby provides an electrical connection between the pin and busbar.

In alternative embodiments (not shown), other elements may be used in place of jumpers to connect the pins to the busbars, such as conductive wires.

FIGS. 6A and 6B illustrate detailed views of jumpers 145, including a small jumper 225 in FIG. 6A and a large jumper 230 in FIG. 6B. As seen in FIGS. 6A and 6B, small jumper 225 is sized to connect a pin 155 or 195 to an adjacent busbar 135, while large jumper 230 is sized to connect a pin 155 or 195 to a busbar 135 located further away. The large jumper 230 can be sized to connect a pin to a busbar that is two busbars away, three busbars away, or more than three busbars away. Small jumper 225 includes a width W1 and a length L1, and large jumper 230 includes a width W2 and a length L2. In this embodiment, L2 is greater than L1, and W1 is equal to W2. In alternative embodiments (not shown), W1 may be greater or less than W2.

With respect to FIGS. 5, 6A, and 6B, small jumpers 225 are configured such that openings 220 are close to grooves 215, and are used for connections where the respective pin 155 or 195 is adjacent to the busbar 135 to which it is to be connected. Large jumpers 230 are configured such that openings 220 are farther away from grooves 215, and are used for connections where the respective pin 155 or 195 is not adjacent to the busbar 135 to which it is to be connected.

In alternative embodiments (not shown), jumpers could take other forms different from the form shown in FIG. 5, as long as the jumper is capable of providing an electrical connection between a pin and a busbar.

Returning to FIG. 5, busbar cap 140 is configured to be included on one or both ends of the set of busbars 135, to maintain the spacing between busbars 135. Busbar cap 140 includes two protruding arms 235 that snap onto PCBA 150.

Figure 5A:
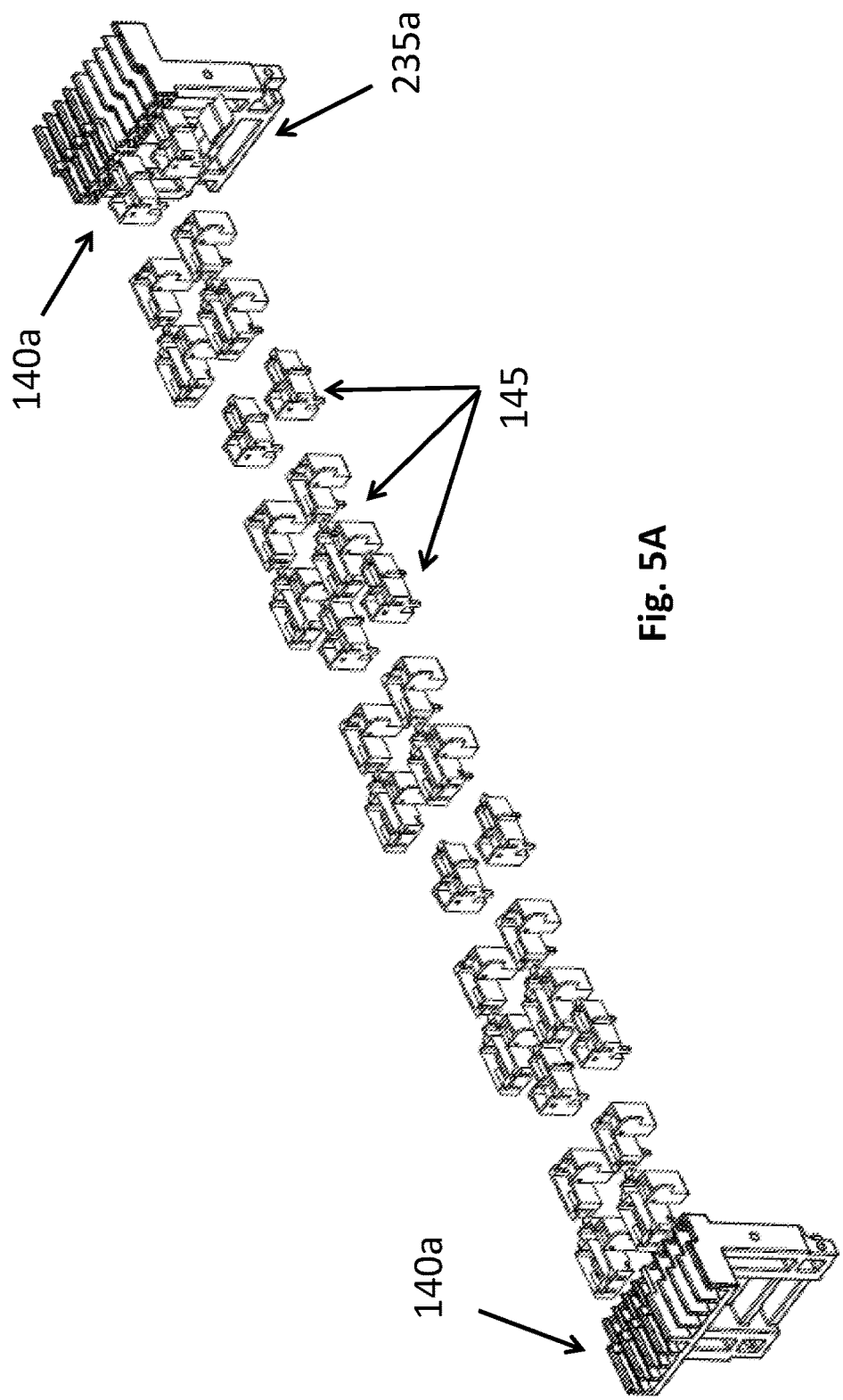
FIG. 5A is a detailed view of an alternative embodiment of jumpers and busbar caps.

FIG. 5A illustrates a detailed view of an alternative embodiment of jumpers 145 and busbar caps 140a. In this embodiment, each busbar cap 140a may attach to the outlet module faceplate by a stand 235a. In other alternative embodiments (not shown), the busbar caps may be configured to only attach only to the busbars. In another alternative embodiment, the busbar caps may be omitted.

Figure 7:
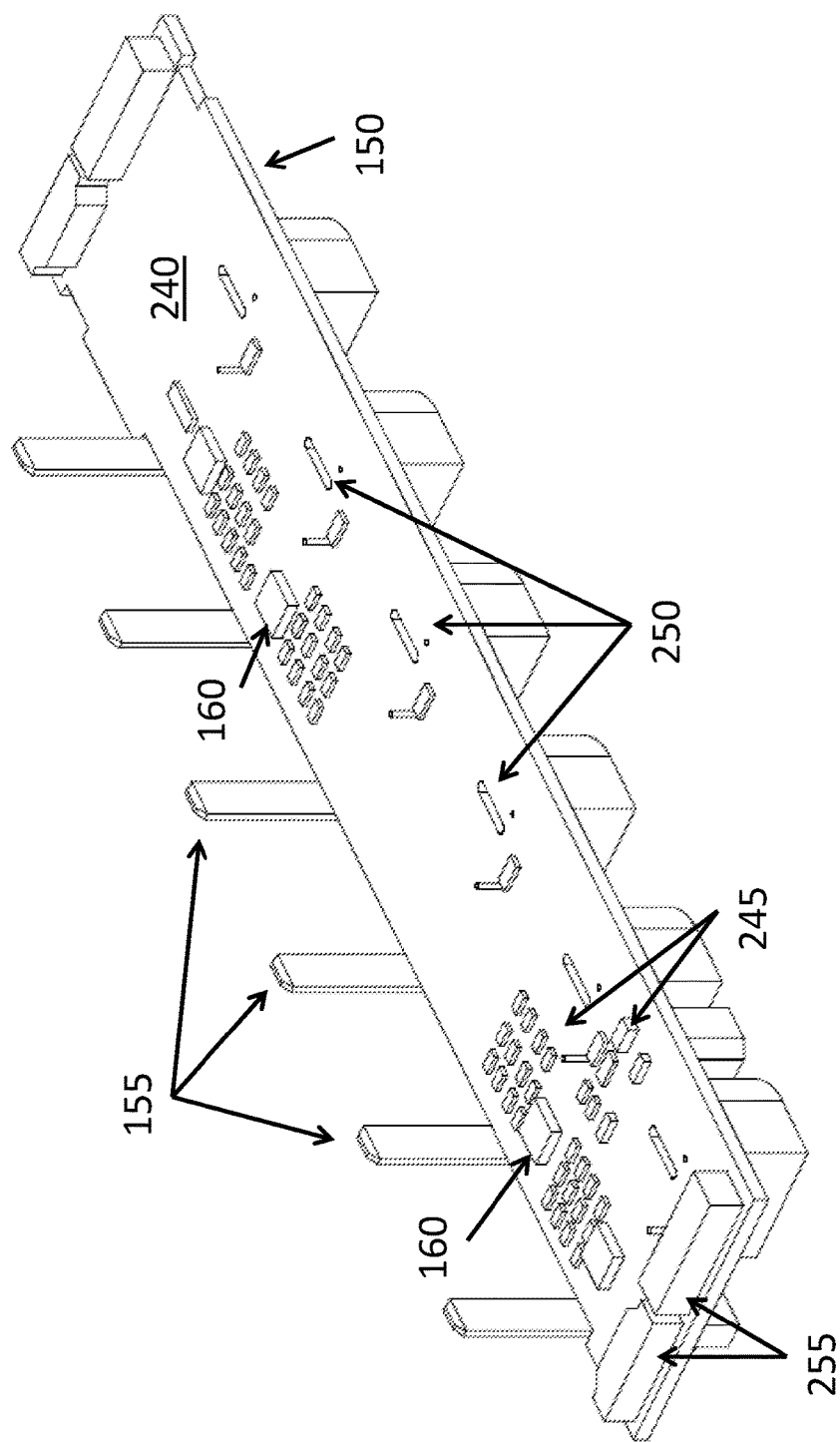
FIG. 7 is a detailed view of the printed circuit board assembly of the outlet module section of FIG. 2.

With reference to FIG. 7, the PCBA 150 has a primary surface 240, and includes six PCBA pins 155 extending away from the primary surface 240 in a perpendicular direction. Each PCBA pin 155 is electrically connected to a relay on relay board 170, which in turn is electrically connected to an outlet 130 via a line terminal of the outlet (not shown), so that each outlet 130 is electrically connected to a single PCBA pin 155. PCBA 150 further includes two microprocessors 160 that receive signals from a plurality of sensors 245 that corresponds to measurements relevant to the power distribution, such as current and voltage, from which power and energy can be calculated. Microprocessors 160 further communicate this information to the communications module 120. PCBA 150 further includes a plurality of pin slots 250 sized and shaped to receive outlet pins 195. PCBA 150 further includes communication ports 255 that connect to communication ports on relay boards 170 for communication and control purposes, so that microprocessors 160 can receive signals from and send control signals to elements on relay board 170 and communications module 120.

In alternative embodiments (not shown), PCBAs can include a different arrangement of components, such as a single microprocessor, other logic elements, and/or a microcontroller.

PCBAs of adjacent outlet module sections are connected to one another via the communications port. In alternative embodiments, adjacent outlet module sections may be connected to one another through a second communications port (not shown).

Figure 8:
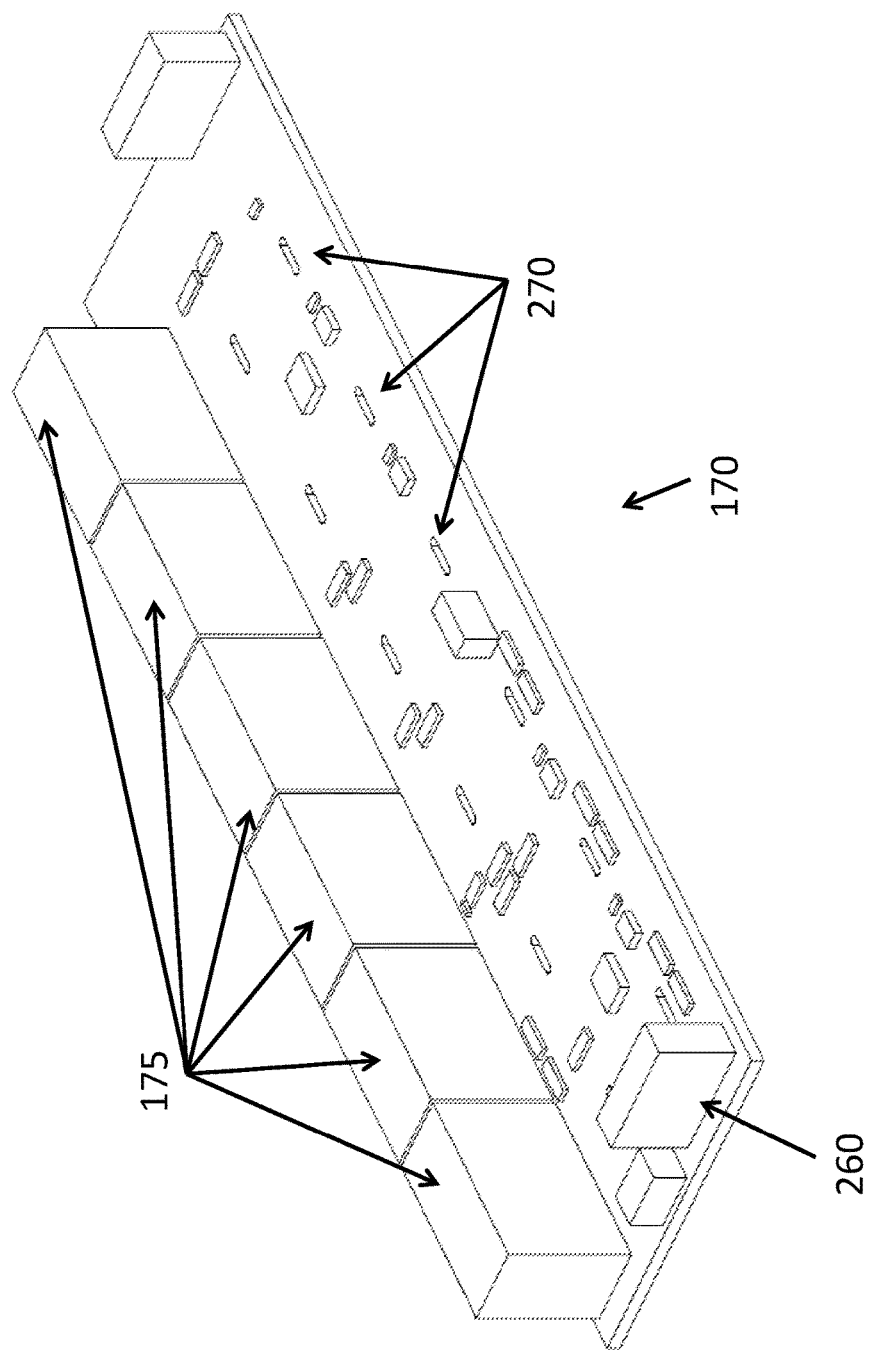
FIG. 8 is a detailed view of the relay board of the outlet module section of FIG. 2.

With respect to FIG. 8, relay board 170 includes a plurality of relays 175 that are configured to distribute power to outlets 130. Relay board 170 further includes communication ports 260 that can be connected to communication ports 255 of PCBA 170. Relays 175 can be switched on or off via control signals sent from microprocessors 160 and received through communication ports 260. Each relay 175 is electrically connected to a corresponding outlet 130, and allows electricity to pass to that outlet 130. Relay board 170 further includes light emitting diodes ("LEDs"), which are observable to users of the PDU 100. LEDs can provide information related to the operating status of each outlet or groups of outlets, such as whether current is flowing to a particular outlet, whether a threshold current has been exceeded, or whether the relay 175 corresponding to that outlet is open or closed. Relay board 170 further includes a plurality of slots 270 that are sized and shaped to receive outlet pins 195 there through.

Figure 9:
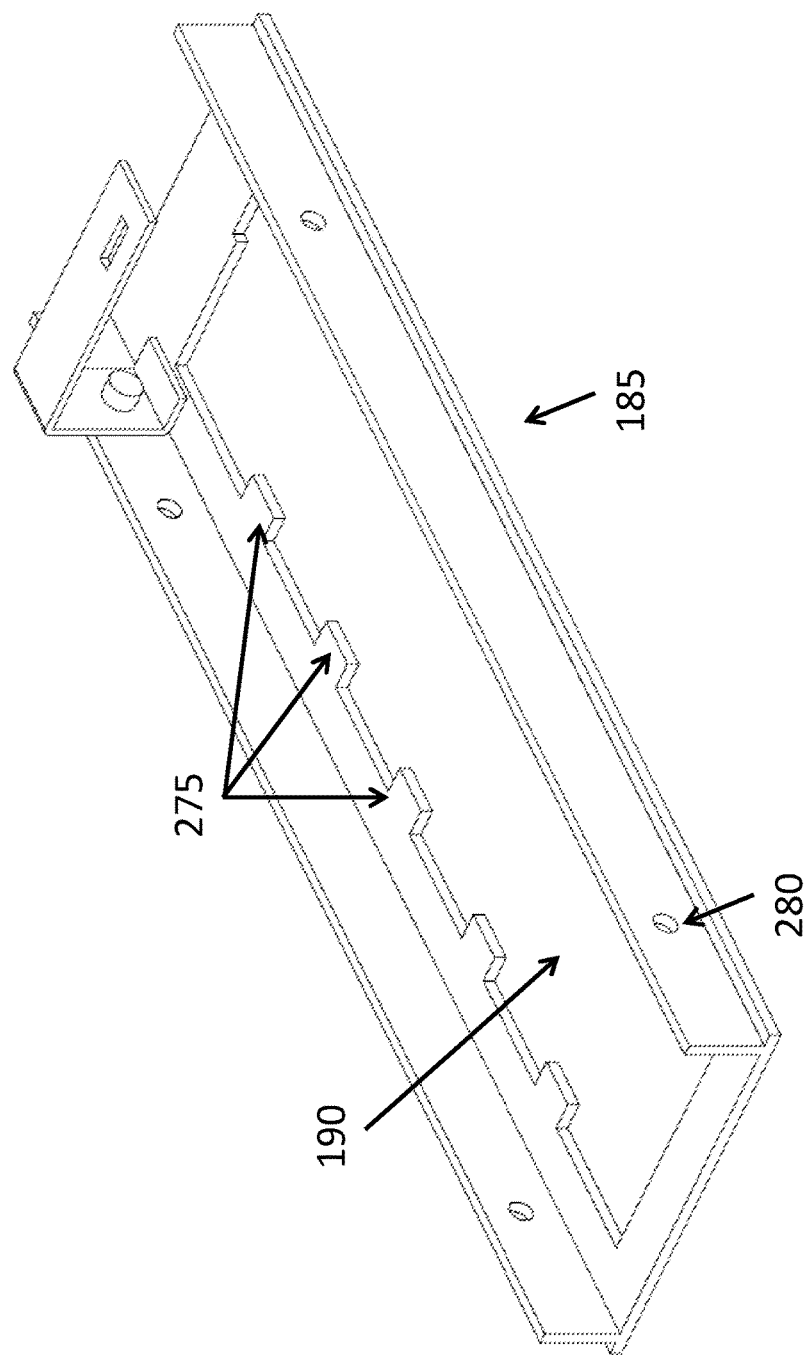
FIG. 9 is a detailed view of a portion of the chassis that extends into the outlet module section of FIG. 2.

FIG. 9 shows a portion of chassis 185, which is configured to receive outlets 130 in a snap-fit engagement. Chassis 185 extends the entire length of the outlet module 115 in the present embodiment, and includes openings 190 (one opening 190 is shown in FIG. 9) that receive the outlets 130 of each outlet module section 125. The openings 190 include protrusions 275 that align with indentations on outlets 130, allowing the outlets 130 to be in alignment when installed. Chassis 185 further includes fastener holes 280 on sidewalls of chassis 185 that are configured to receive mechanical fasteners (not shown) that are used to fix the outlet module 115 to housing 123.

Figure 10:
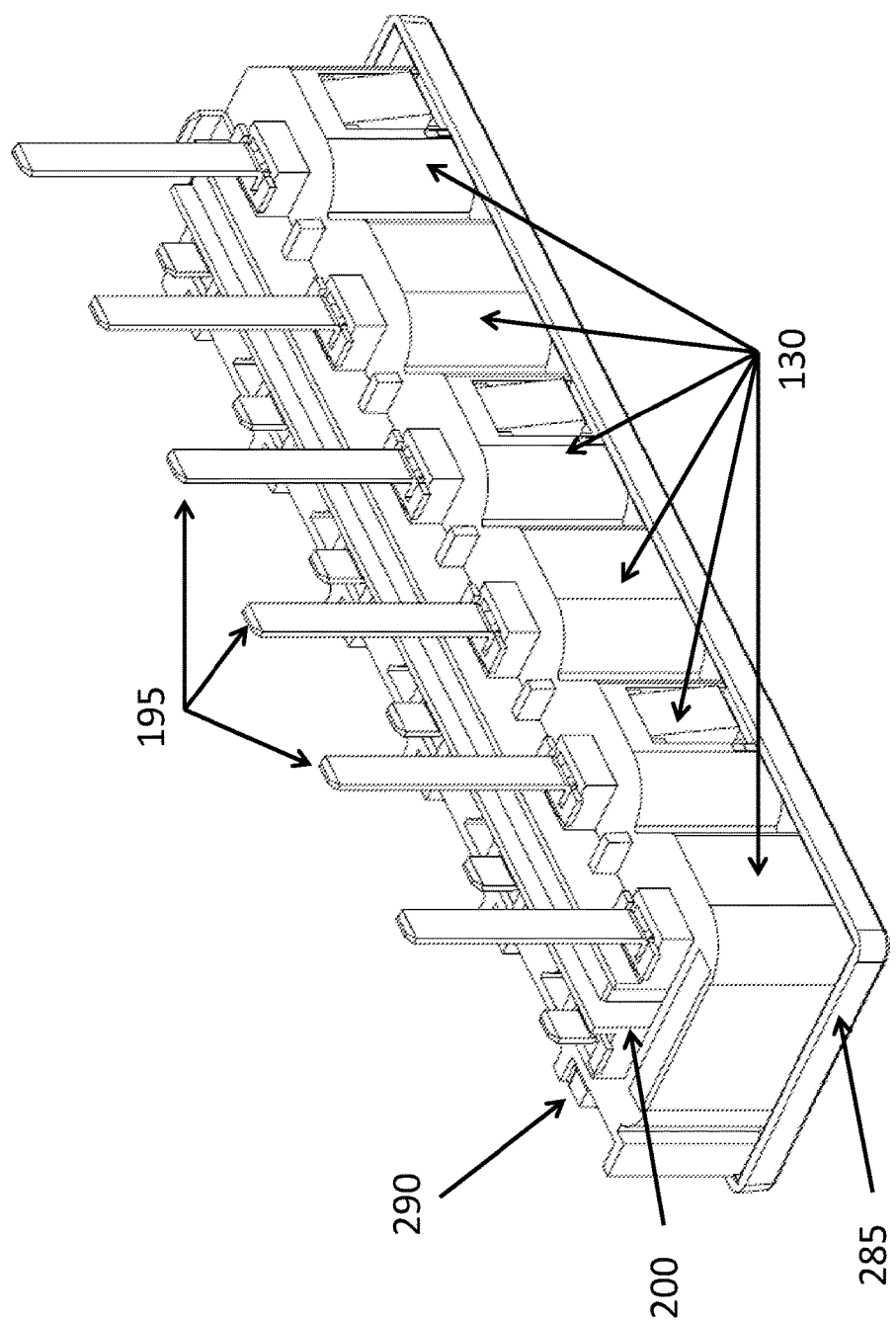
FIG. 10 is a detailed view of the outlets in the outlet module section of FIG. 2.

FIG. 10 shows outlets 130 in one outlet module section 125. Outlets 130 each include an outlet pin 195 extending away from a socket surface of the outlet 130. The outlets 130 are a group in one-piece plastic, and an integrated ground busbar 200 provides electrical ground to all six outlets. Alternative embodiments (not shown) have individual plastic outlets that do not have ground busbar 200.

Outlets 130 are also all attached to outlet faceplate 285. Outlets 130 can be fixed to faceplate 285 via a snap-fit type connection, through use of an adhesive, or with mechanical fasteners. Outlets 130 further include indentations 290 that align with protrusions 275 of chassis openings 190, to provide an aligned and secure connection therewith. Each outlet 130 is further electrically connected to a relay 175 via mating electrical conductor elements located on relay 175 and outlet 130, so that outlets 130 receive current through relays 175. In the outlet module section 125 shown, six outlets 130 are provided, but in alternative embodiments (not shown), fewer or greater outlets may be provided in an outlet module section.

FIG. 11A illustrates a more detailed view of one embodiment of a busbar cap 140. Busbar cap 140 includes two protruding arms 235 that snap onto PCBA 150. Busbar cap 140 further includes a plurality of busbar cap grooves 295, which are sized and shaped to receive busbars 135 therein. Busbar cap grooves 295 are sized so that busbars 135 fit snugly within the grooves 295. Busbar cap 140 further includes a back wall 297, so that busbars 135 cannot extend beyond busbar cap 140.

FIG. 11B illustrates an alternative embodiment of a busbar cap 300. The busbar cap 300 may be referred to as an intermediate busbar cap, which is substantially the same as busbar cap 140, except for the omission of a back wall. Intermediate busbar cap 300 can be used in between the ends of busbars 135, to provide guidance and spacing for the busbars in an intermediate location. Alternatively, busbar cap 300 can be used at the ends of busbars 135.

FIGS. 11C and 11D illustrate other alternative embodiments of a busbar cap 400 and an intermediate busbar cap 500. Busbar cap 400 and intermediate busbar cap 500 are substantially the same as busbar cap 140 and intermediate busbar cap 300, respectively, except that they lack protruding arms and thus do not snap onto PCBA 150.

Figure 11F:
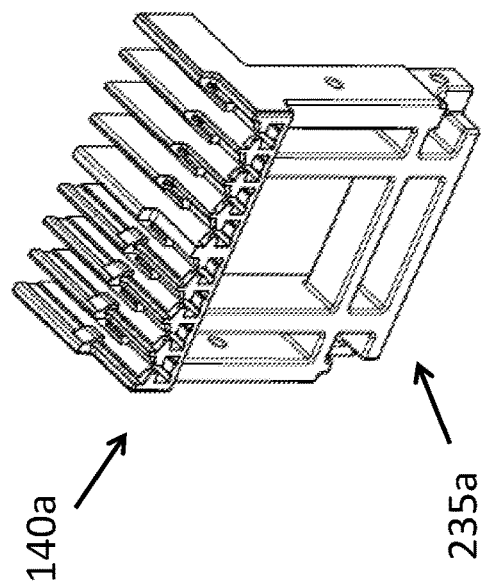
FIG. 11F is a rear detailed view of an alternative embodiment of a busbar cap.
Figure 11G:
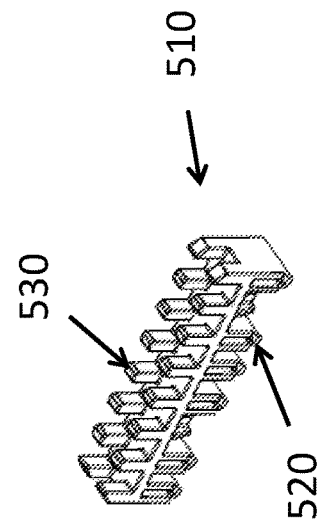
FIG. 11G is a detailed view of an alternative view of a busbar spacer.
Figure 11E:
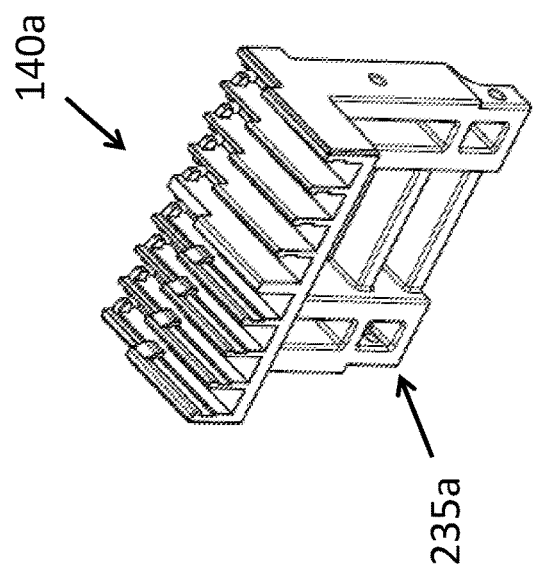
FIG. 11E is a front detailed view of an alternative embodiment of a busbar cap.

FIGS. 11E and 11F illustrate a front and rear detailed view, respectively, of an alternative embodiment of a busbar cap 140a. In this embodiment, the busbar cap 140a may attach to the outlet module faceplate by a stand 235a. The busbar cap 140a is otherwise substantially similar to the busbar cap 140 described above.

FIG. 11G is a detailed view of an alternative view of a busbar spacer 510. The busbar spacer 510 is an integrated component that includes busbar grooves 520 and wire route guides 530. The busbar grooves are sized so that busbars 135 fit snugly within the grooves 530. The wire route guides 530 are sized to retain a wire.

Figure 12:
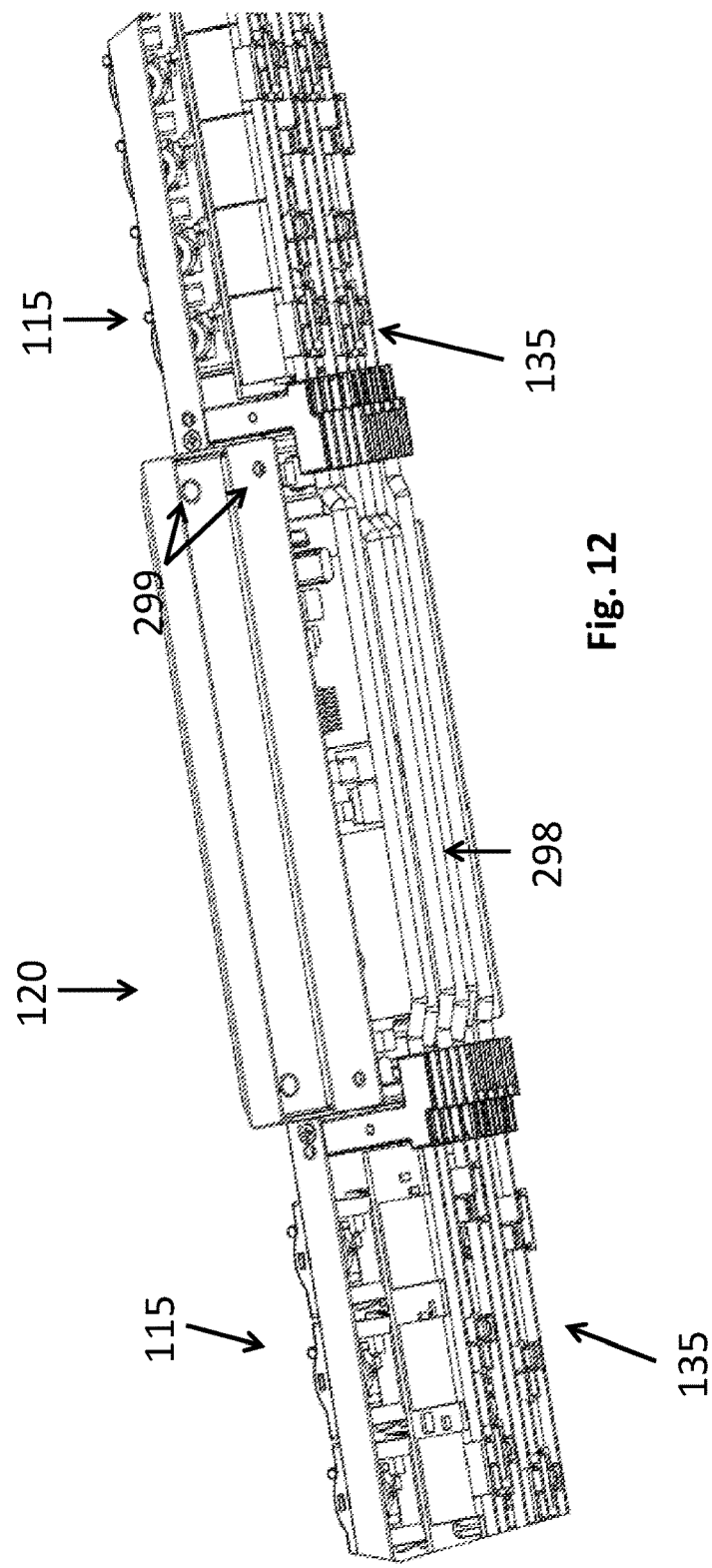
FIG. 12 is a detailed view of the interfaces between the communications module and outlet modules according to the embodiment of FIG. 1.

FIG. 12 depicts a detail view of the interface between outlet modules 115 and communications module 120. As seen in FIG. 12, the outlet modules 115 are not connected to the communications module 120, and are not mechanically connected to each other. There are no mechanical structures that connect outlet modules 115 to communications module 120, or to each other. The busbars 135 of each outlet module 115 are electrically connected via wires 298, so that each busbar 135 is individually electrically connected to its corresponding busbar in the other outlet module. Wires 298 do not provide any structural or mechanical support, and merely pass electricity from one outlet module to the other. With this arrangement, the busbars in the outlet modules are connected to the same circuit protection devices in power module 110. Communications module 120 includes data wires (not shown) that separately connect to each of the PCBAs 150 of the outlet module sections 125, allowing independent data communication between the communications module 120 and each outlet module 115. Communications module 120 further includes through holes 299 that are sized and shaped to receive mechanical fasteners (not shown) for affixing housing 123 to communications module 120.

In alternative embodiments (not shown), the busbars 135 could run the length of the entire PDU 100, eliminating the need for wires 298. In other alternative embodiments where the power module contains six circuit protection devices (not shown), the busbars in the outlet module further away from the power module could be independently electrically connected to three of the circuit protection devices, while the busbars in the closer outlet module are connected to the three other circuit protection devices. In such an arrangement, each outlet module would independently receive electricity from the power module.

With reference to FIGS. 1-12, an assembly process of outlet module section 125 will be described. Initially, outlets 130 are snapped into chassis openings 190, so that protrusions 275 of the chassis openings 190 are aligned with indentations 290 in the outlets 130. Relay board 170 is then placed on top of chassis 185, so that slots 270 receive outlet pins 195 extending from outlets 130. The outlet pins 195 are then soldered to the relay board 170 to provide a permanent connection. At this point, the outlets 130 and relay board 170 are permanently fixed to the chassis 185, and cannot be removed. Next, the PCBA 150 is set on top of the relay board 170, such that the PCBA slots 250 receive outlet pins 195. PCBA 150 can be soldered to pins 195, and/or fixed to the relay board 170 using mechanical fasteners, such as screws or bolts. The communication ports 255 on PCBA and communication ports 260 on relay board are connected with communications cables. Next, jumpers 145 are connected to the pins 155, 195, so that each outlet 130 can be connected to both a busbar that provides current and the corresponding neutral busbar, to complete a circuit. The busbars 135 are then placed on top of jumpers 145, and spaced apart with a busbar cap or spacer 140. This same process is repeated for each outlet module section 125 in outlet module 115, using the same chassis 185 and same set of busbars 135. Data connections are made between the PCBAs 150 of each outlet module section 125 in the entire outlet module 115. Busbars 135 are then connected to the circuit protection devices in power module 110 via wiring or other conductors. Outlet module 115 is then placed adjacent to power module 110 on one side and adjacent to communications module 120 on the other side. A second outlet module 115 can be placed adjacent to the other side of communications module 120. The busbars 135 of each outlet module 115 are electrically connected via wires 298, which provide no structural or mechanical support. Data connections are then individually made between the communications module 120 and the outlet modules 115. The housing 123 is then separately fastened to the power module 110, outlet modules 115, and communication module 120 using mechanical fasteners that engage with holes 280, 299 of chassis 185 and communication module 120, respectively. Each module is individually and separately attached to the housing 123, and no module is mechanically fastened to any other module. The only connections between modules are non-structural electrical or data connections.

In alternative embodiments (not shown), the busbars can extend from the power module of the PDU through all other modules included in the PDU, eliminating the need for wires 298. In other alternative embodiments (not shown), other arrangements of modules may be used in the PDU, such as a separate circuit protection device module, fewer or greater than two outlet modules, fewer or greater than one communications module, and combinations thereof. In other alternative embodiments (not shown), two outlet modules can be electrically connected to separate sets of three circuit protection devices (using wiring for example), and are not electrically connected to each other at all. In other alternative embodiments (not shown), the number of busbars can be fewer or greater than six, for example, four or eight busbars may be employed.

Figure 13:
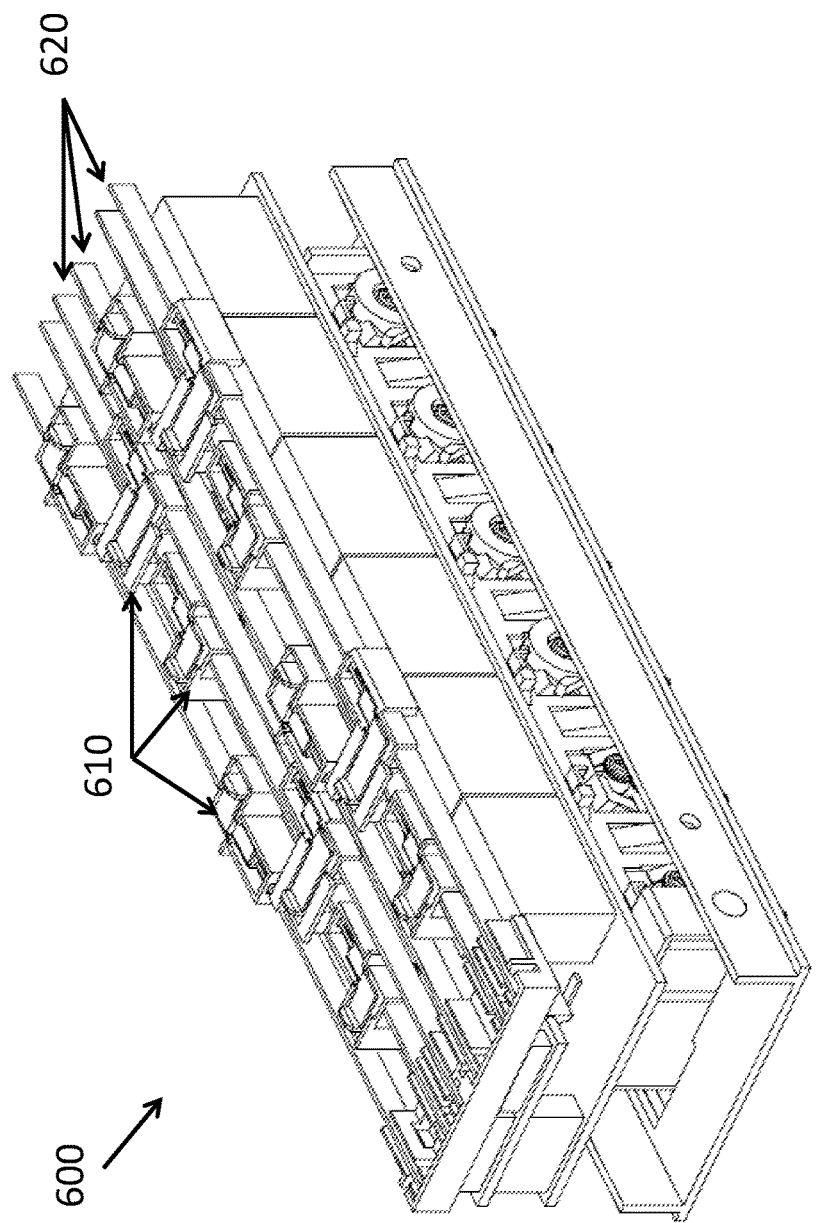
FIG. 13 is a perspective view of an embodiment of an outlet module section having jumpers installed outside of busbars.

FIG. 13 illustrates an alternative embodiment of an outlet module section 600, where jumpers 610 are located outside of busbars 620. In this embodiment, the functionality of the components are identical to that of the embodiment of FIGS. 1-12, except that the jumpers 610 are located on the outside of busbars 620. Jumpers 610 still provide the same functionality, and are configured to connect the busbars 620 to pins, but are installed on the outlet module section 600 after the busbars 620 have been placed in the appropriate positions over the outlet module section 600.

Figure 13A:
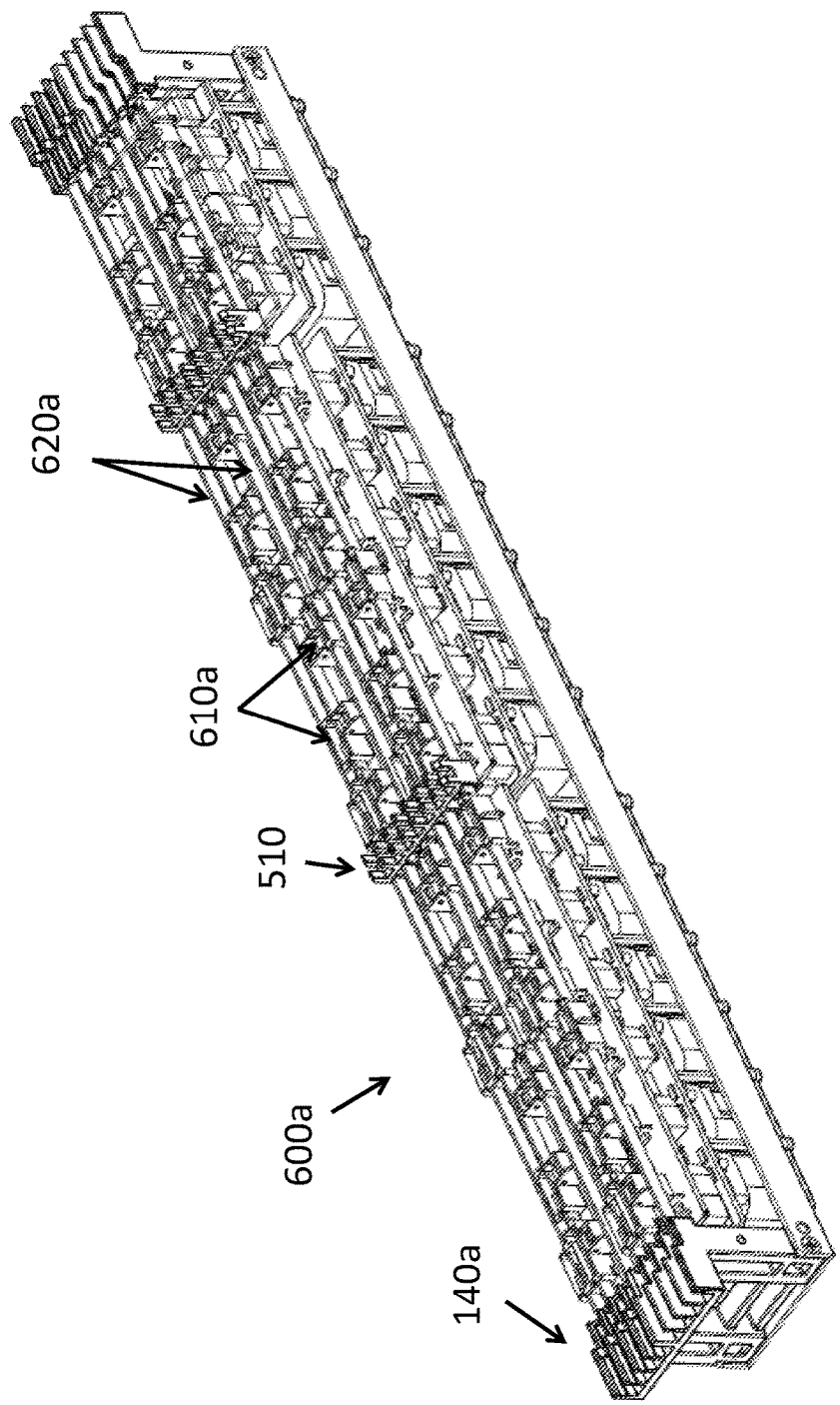
FIG. 13A is a perspective view of an alternative embodiment of an outlet module section having jumpers installed outside of busbars.

FIG. 13A illustrates a perspective view of another alternative embodiment of an outlet module section 600a, with jumpers 610a located outside of busbars 620a. In this embodiment, the outlet module section 600a further includes the alternative busbar caps 140a and the busbar spacers 510 described above.

Figure 14:
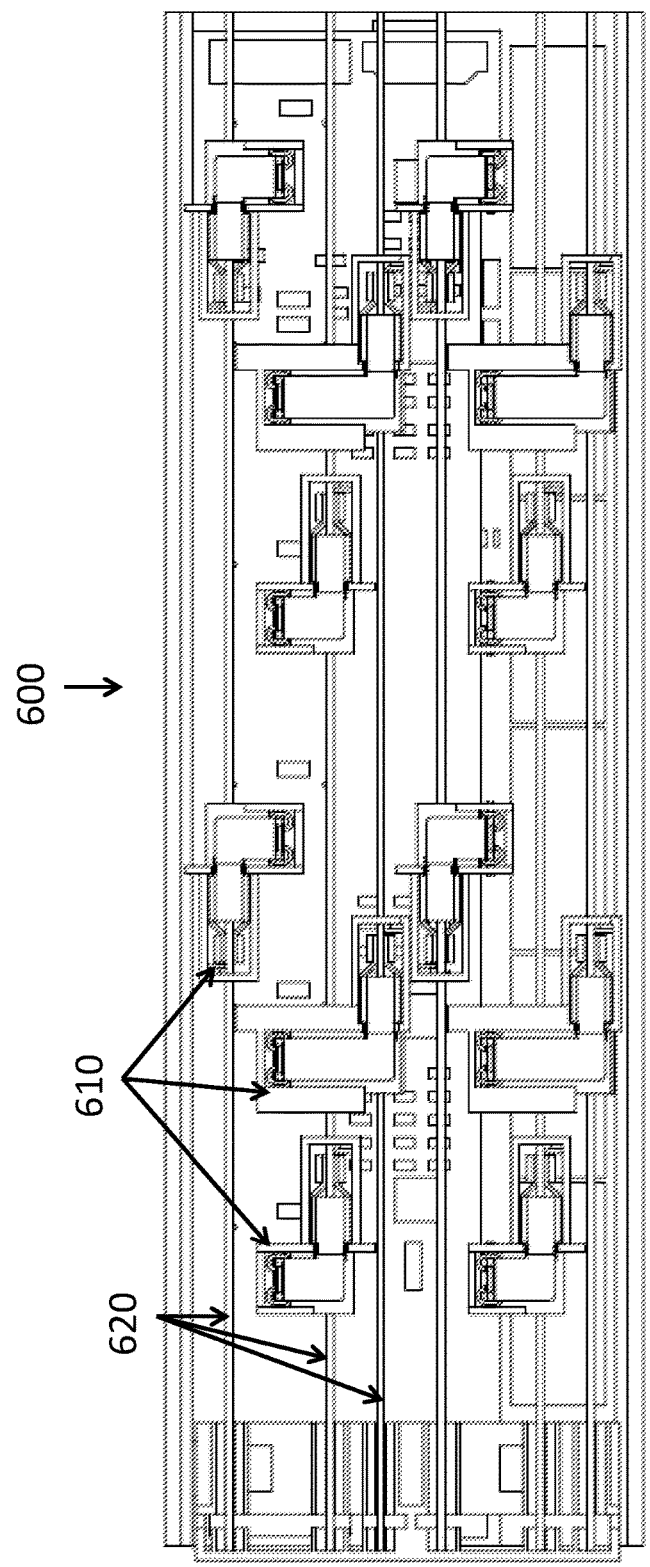
FIG. 14 is a top view of the outlet module section of FIG. 13.

FIG. 14 illustrates a top view of the outlet module section 600, to better show the jumpers 610 affixed to busbars 620. As seen in FIG. 14, both small and large jumpers 610 are used to connect pins to adjacent or distal busbars 620.

Figure 15:
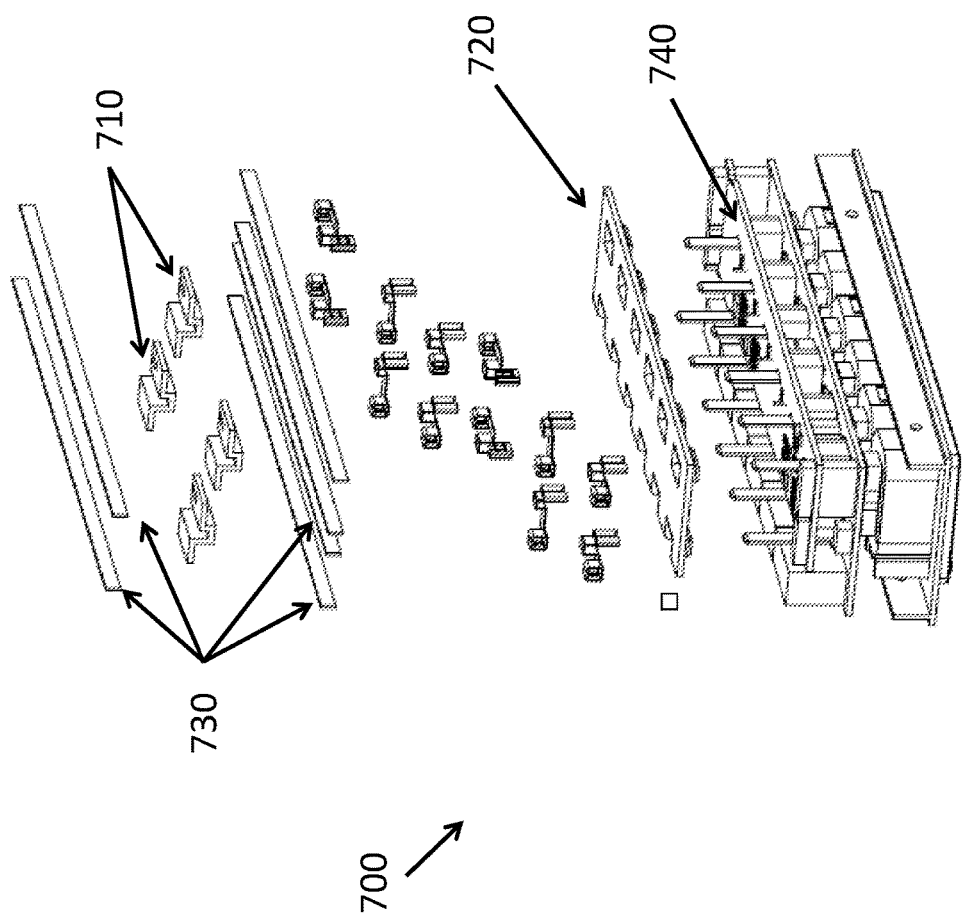
FIG. 15 is an exploded view of an outlet module section according to another embodiment having insulators.

FIG. 15 illustrates an alternative embodiment of an outlet module section 700, which includes busbar insulators 710 and pin insulator 720. Outlet module section 700 otherwise includes identical components as the outlet module section 125 described above with respect to FIGS. 1-12, and functions identically to outlet module section 125. Busbar insulators 710 separate adjacent busbars 730 to prevent the busbars 730 from touching, eliminating the possibility of a short circuit. Pin insulator 720 further ensures that none of the pins comes into contact with each other or an intermediary conductor, also preventing the possibility of a short circuit.

Figure 16:
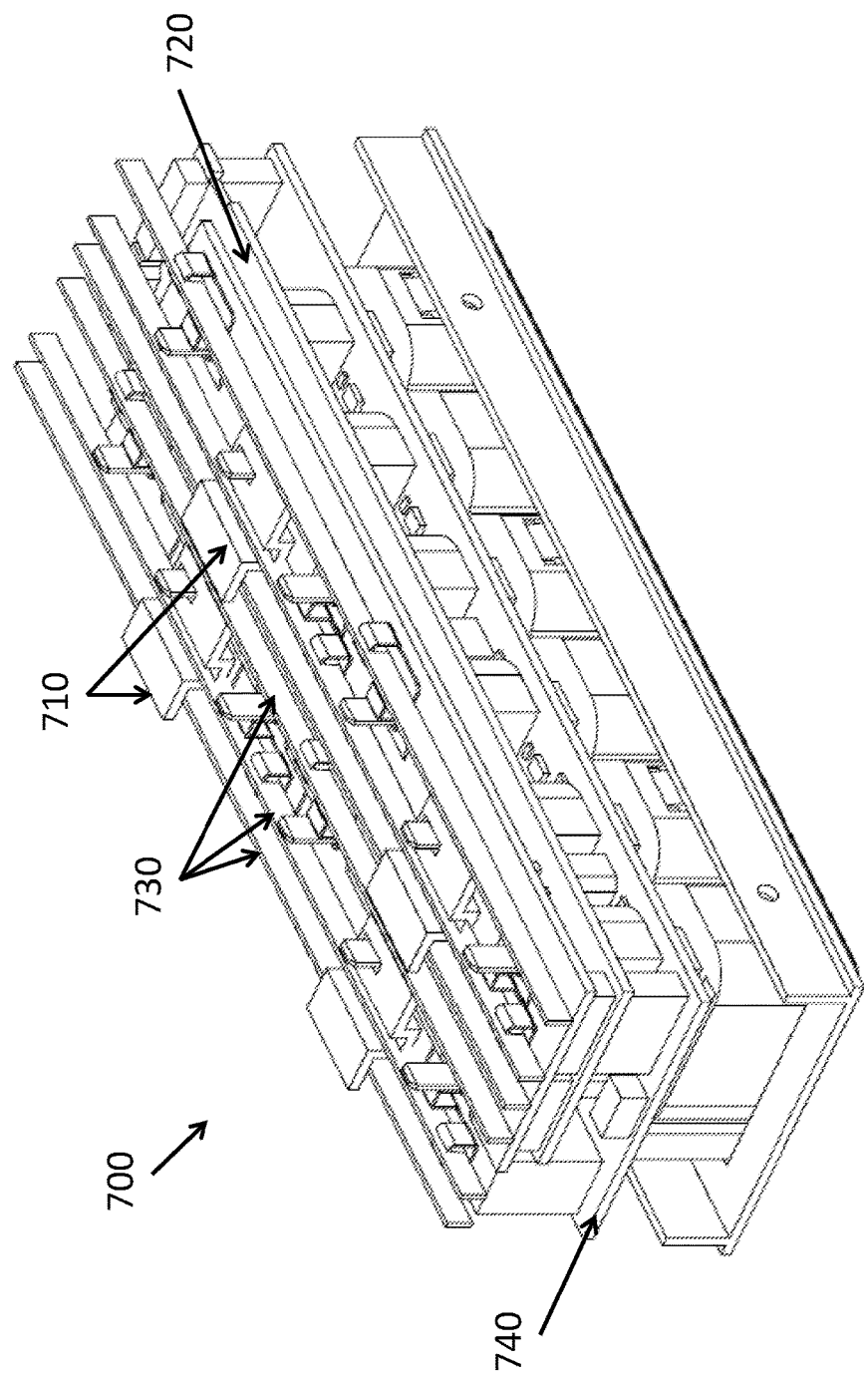
FIG. 16 is a perspective view of the outlet module section of FIG. 15.

FIG. 16 illustrates the outlet module section 700 in an assembled condition. As seen in FIG. 16, busbar insulators 710 prevent adjacent busbars from touching, and pin insulator 720 separates pins from one another, as well as provides an electrically insulated layer between the busbars 730 and PCBA 740.

Figure 17:
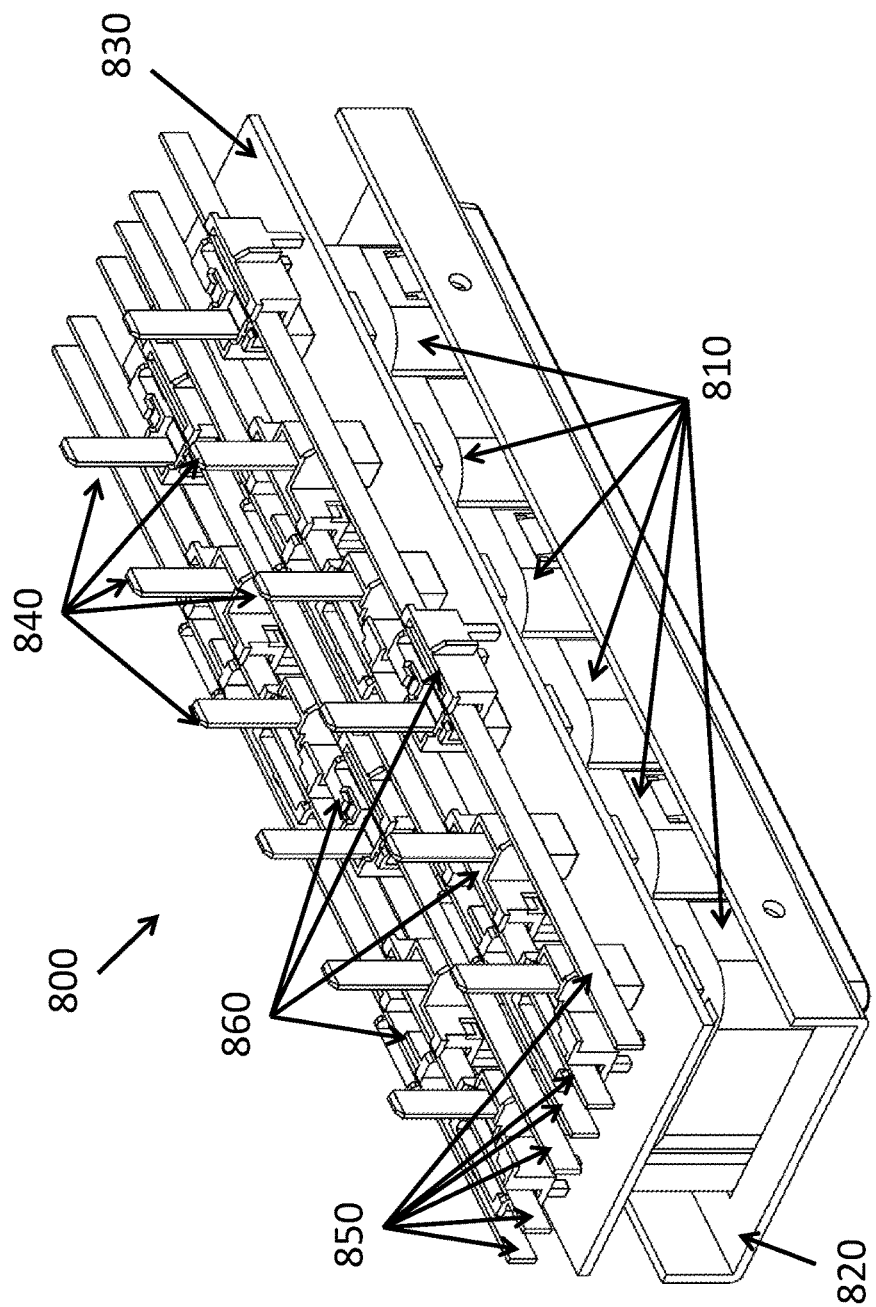
FIG. 17 is a perspective view of an outlet module section in another embodiment of the invention for a basic PDU.

FIG. 17 illustrates another embodiment of an outlet module section 800 that omits a PCBA and relay board. Outlet module section 800 in this embodiment is part of a simple PDU that does not include outlet switching or outlet metering, and it may or may not include a communications module. As seen in FIG. 17, the outlet module section 800 includes a plurality of outlets 810 fixed to a chassis 820, and further includes a flat insulator sheet 830 resting on one side of outlets 810. Flat insulator sheet 830 is designed to prevent short circuits. Each outlet 810 further includes two-outlet pins 840 extending from a back side of each outlet. In this embodiment, the outlet module section 800 does not include relays, so each outlet 810 includes two outlet pins 840 to complete a circuit with busbars 850. Busbars 850 provide power to the outlet module section 800 and jumpers 860 connect the busbars 850 to the outlet pins 840. Jumpers 860 are sized and shaped similar to the jumpers shown in the embodiments discussed above, and provide an electrical connection between outlet pins 840 and busbars 850 as discussed in earlier embodiments.

Figure 18:
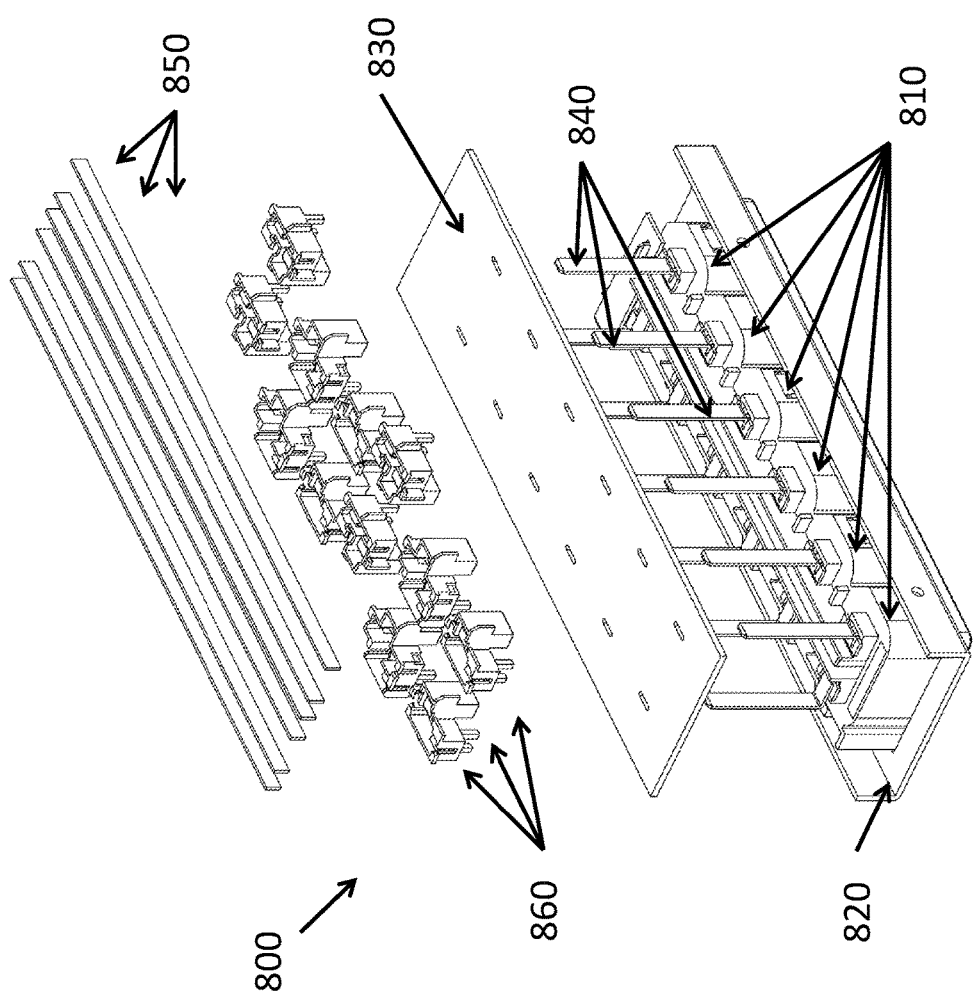
FIG. 18 is an exploded view of the outlet module section of FIG. 17.

FIG. 18 shows the outlet module section 800 in an exploded view, to better illustrate the flat insulator sheet 830 resting between the outlets and the jumpers 860. Flat insulator sheet 830 separates the outlet pins 840 from each other, and provides an insulating layer between the current-carrying busbars 850 and the outlets 810. Flat insulator sheet 830 includes a plurality of slots sized and shaped to receive one of outlet pins 840, to permit an electrical connection between the outlets and busbars via outlet pins 840 only. The flat insulator sheet 830 thereby prevents any accidental contact between conductive elements to prevent short-circuiting.

In alternative embodiments (not shown), the flat insulator sheet can be omitted, or a plurality of insulator sheets can be included instead of a single flat insulator sheet.

Figure 19A:
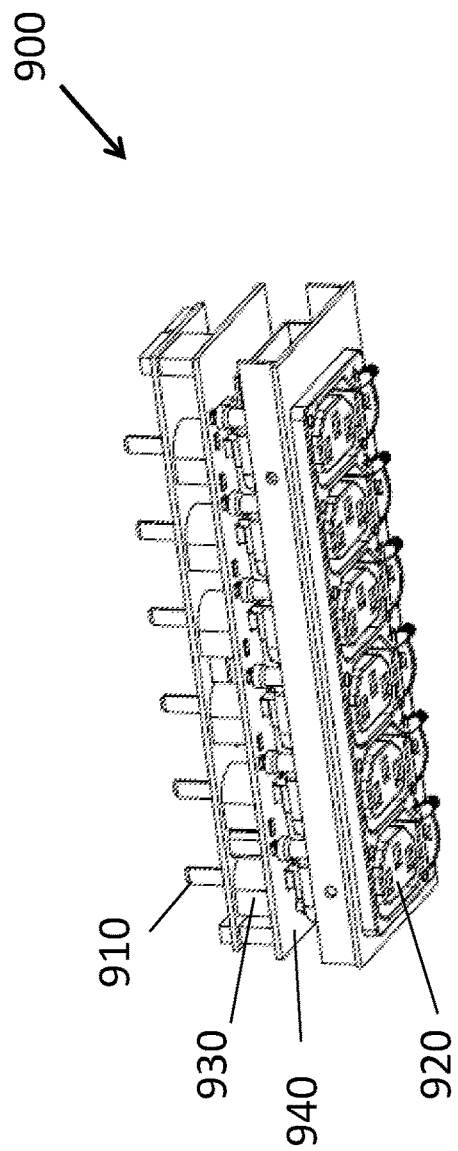
FIGS. 19A and 19B illustrate upper and lower perspective views of an alternative embodiment of an output module for a power distribution unit.
Figure 19B:
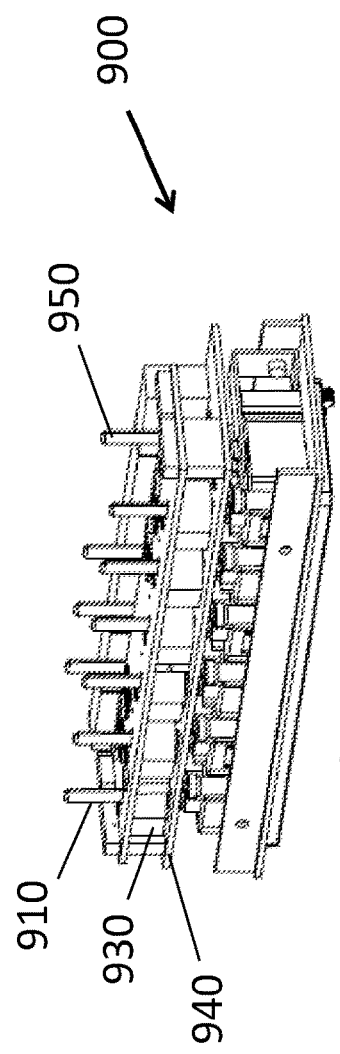

FIGS. 19A and 19B illustrate upper and lower perspective views of an alternative embodiment of an outlet module 900 for a power distribution unit. In this embodiment, the outlet module 900 includes an outlet on/off control, voltage and current measurement, and supports alternating phase arrangements. The outlet module 900 includes a plurality of long neutral/line pins 910 that extends from each outlet 920 through current transformers 930. The current transformers 930 measure the current on the long neutral/line pins 910 and are attached to a printed circuit board 940.

The outlet module 900 further includes a plurality of long tabs 950 that are attached to the printed circuit board 940. In one embodiment, the long tabs are soldered to the printed circuit board and function as extensions of the short neutral/line pins (not shown). Together, the long neutral/line pins 910 and the long tabs 950 can be connected by jumpers (such as the jumpers discussed above) or other electrical connectors to busbars or wires to realize an alternating-phase arrangement.

Figure 19C:
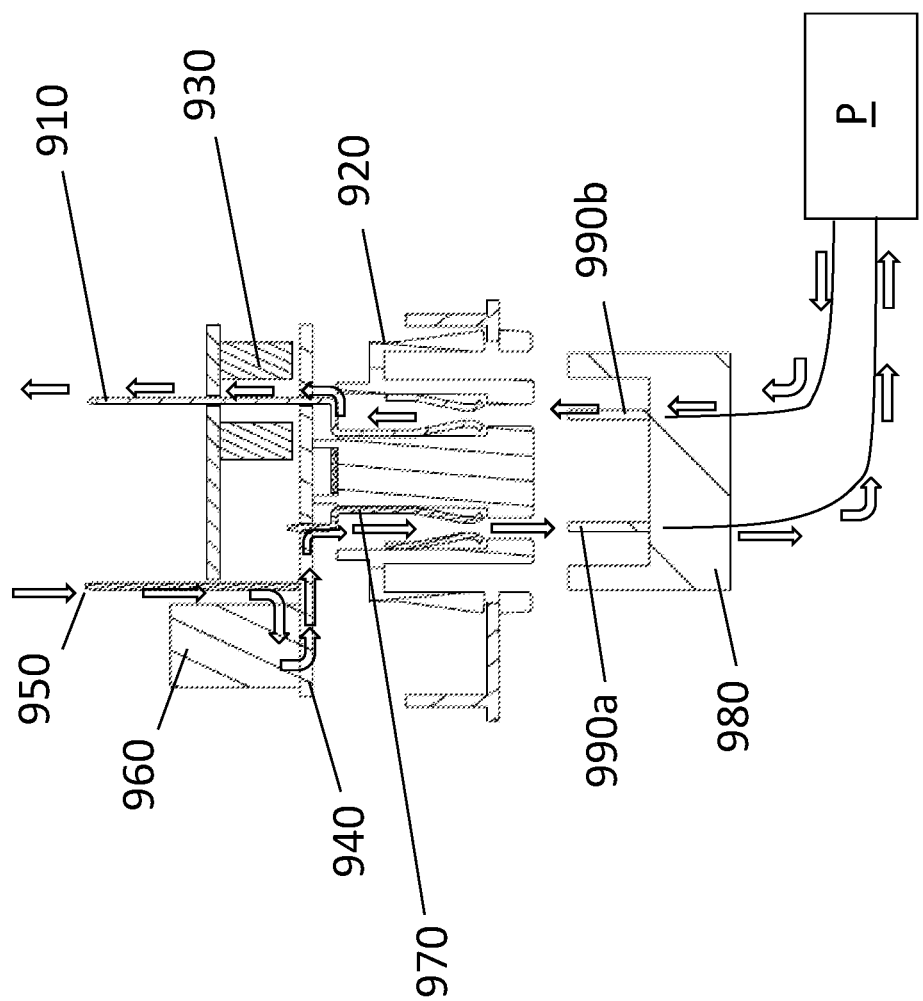
FIG. 19C is a cross-section of the outlet module of FIGS. 19A and 19B.

FIG. 19C is a cross-section of the outlet module 900. In the illustrated embodiment, the current travels from the long tab 950 to the printed circuit board 940 through a relay 960. The direction of the current is shown by the series of arrows. The relay 960 can control the on/off of the outlet module 900. A short pin 970 of the outlet 920 is connected to the printed circuit board 940.

A plug 980 having first and second pins 990a,b is connected to a power source P. When the plug 980 inserted into the outlet 920, the first pin 990a contacts the short pin 970 and the second pin 990a contacts the long neutral/line pin 910. The current thus travels through the current transformer 930 as shown, so that the current transformer can measure the current.

The use of the long pins and tabs with the current transformer in the arrangement shown in FIG. 19A-C reduces the space required for current measurement compared to prior arrangements.

FIG. 20 is a perspective view of one embodiment of an input module connected 1000 to an output module 1010. As can be seen in this view, the input module 1000 includes wires 1020 that are received by a busbar end cap 140a on the output module 1010 and are thereby connected to busbars 610a.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative system and method, and illustrative examples shown and described. Accordingly, departures may be made from such details without departing from the spirit or scope of the applicant's general inventive concept.

What is claimed is:

1. A power distribution unit ("PDU,") comprising:
    an input power component;
    a first outlet component including a first plurality of outlets permanently fixed to a first chassis and a plurality of first busbars extending the length of the first outlet component,
        wherein the first plurality of outlets includes multiple first groups of outlets,
        wherein each first group of outlets includes a first printed circuit board assembly ("PCBA") having at least one microprocessor, and
        wherein the first busbars are electrically connected to the input power component;
    a communications component in signal communication with the first outlet component for transferring data; and
    a housing connected to the input power component, the first outlet component, and the communications component.

2. The PDU of claim 1, further comprising a second outlet component,
    wherein the second outlet component includes a second plurality of outlets permanently fixed to a second chassis, and a plurality of second busbars extending the length of the second outlet component.

3. The PDU of claim 1, wherein each first group of outlets includes a relay board containing a plurality of relays, each relay capable of electrically connecting or disconnecting an outlet to a busbar.

4. The PDU of claim 1, wherein each of the first groups of outlets are electrically connected to the first busbars via a plurality of jumpers.

5. The PDU of claim 4, wherein each outlet includes an electrically conductive outlet pin that is electrically connected to one of the plurality of jumpers, and wherein the jumper is also electrically connected to a busbar.

6. The PDU of claim 4, wherein the plurality of jumpers includes first jumpers having a first length and second jumpers having a second length greater than the first length.

7. A power distribution unit ("PDU") assembly comprising:
    a plurality of outlets;
    at least one pin extending from each outlet;
    a plurality of busbars;
    a plurality of jumpers extending between the busbars and the outlet pins,
        wherein each jumper electrically connects a single outlet pin to a single busbar; and
    a flat insulator sheet located between the outlets and the electrical connections,
        wherein the flat insulator sheet includes a plurality of slots sized and shaped to receive the outlet pins.

8. The PDU assembly of claim 7, further including a chassis having a plurality of openings, each opening sized and shaped to receive a group of outlets.

9. The PDU assembly of claim 7, wherein each outlet is electrically connected to two busbars.

10. The PDU assembly of claim 7, wherein each of the plurality of jumpers includes a non-conductive housing and a conductive element.

11. The PDU assembly of claim 7, wherein the PDU assembly shares a chassis with an input power component.

12. The PDU of claim 7, wherein the plurality of jumpers includes first jumpers having a first length and second jumpers having a second length greater than the first length.

13. A power distribution unit assembly comprising:
    a housing;
    a power source mechanically connected to the housing;
    a plurality of outlets mechanically connected to the housing,
        wherein the plurality of outlets includes multiple groups of outlets, and
        wherein each group of outlets includes a printed circuit board assembly having at least one microprocessor;
    a set of busbars; and a plurality of jumpers that electrically connect at least some of the plurality of outlets to the set of busbars, wherein the plurality of jumpers includes first jumpers having a first length and second jumpers having a second length greater than the first length.

14. The power distribution unit assembly of claim 13, wherein the set of busbars includes a first set of busbars and a second set of busbars, and wherein the first set of busbars are electrically connected to the second set of busbars via one or more wires.

15. The power distribution unit assembly of claim 13, wherein the set of busbars includes a first set of busbars and a second set of busbars, and wherein the first set of busbars and second set of busbars are not electrically connected to each other.

16. The power distribution unit assembly of claim 13, further including a communications module mechanically connected to the housing.

17. The power distribution unit assembly of claim 16, wherein there are no direct mechanical connections between the power source, the plurality of outlets, or the communications module.

18. The power distribution unit assembly of claim 13, wherein at least one of the set of busbars carries an input current, wherein at least one of the set of busbars is a neutral line, and wherein each of the plurality of outlets is connected to the input current by a first jumper and to the neutral line by a second jumper.

19. The power distribution unit assembly of claim 13, wherein at least one of the set of busbars carries current from a first electrical phase, wherein at least one of the set of busbars carries current from a second electrical phase, and wherein each of the plurality of outlets is connected to a first phase by a first jumper and to a second phase by a second jumper.

* * * * *